United States Patent
Yamada et al.

(10) Patent No.: US 8,563,926 B2
(45) Date of Patent: Oct. 22, 2013

(54) METHOD OF MAKING AXIAL ALIGNMENT OF CHARGED PARTICLE BEAM AND CHARGED PARTICLE BEAM SYSTEM

(75) Inventors: Mitsuru Yamada, Tokyo (JP); Motohiro Nakamura, Tokyo (JP); Mitsuru Sato, Tokyo (JP)

(73) Assignee: JEOL Ltd., Tokyo (JP)

( * ) Notice: Subject to any disclaimer, the term of this patent is extended or adjusted under 35 U.S.C. 154(b) by 194 days.

(21) Appl. No.: 13/313,387

(22) Filed: Dec. 7, 2011

(65) Prior Publication Data

US 2012/0138793 A1   Jun. 7, 2012

(30) Foreign Application Priority Data

Dec. 7, 2010   (JP) .................. 2010-272288
Sep. 26, 2011  (JP) .................. 2011-209327

(51) Int. Cl.
*H01J 37/26*   (2006.01)
*G01N 23/00*   (2006.01)
*G21K 7/00*    (2006.01)

(52) U.S. Cl.
USPC ............................ 250/309; 250/307; 250/310

(58) Field of Classification Search
USPC .................................. 250/306, 307, 309–311
See application file for complete search history.

(56) References Cited

U.S. PATENT DOCUMENTS

| | | | | |
|---|---|---|---|---|
| 5,029,019 A * | 7/1991 | Yoshihara et al. | ............ | 358/447 |
| 7,135,676 B2 * | 11/2006 | Nakasuji et al. | ............ | 250/310 |
| 7,297,949 B2 * | 11/2007 | Nakasuji et al. | ............ | 250/307 |
| 7,601,972 B2 * | 10/2009 | Nakasuji et al. | ......... | 250/441.11 |

FOREIGN PATENT DOCUMENTS

JP   7302564 A   11/1995

* cited by examiner

*Primary Examiner* — Bernard E Souw
(74) *Attorney, Agent, or Firm* — The Webb Law Firm

(57) ABSTRACT

A method of making axial alignment of a charged particle beam starts with obtaining at least first through sixth image data while controlling the focal position of the beam on a sample in the direction of incidence, the excitation current in a first alignment coil, and the excitation current in a second alignment coil. Then, values of the excitation currents in the first and second alignment coils for the axial alignment of the beam are calculated from the at least first through sixth image data.

23 Claims, 22 Drawing Sheets

| FRAME | ACCELERATING VOLTAGE | VALUE OF EXCITATION CURRENT IN X ALIGNMENT COIL | VALUE OF EXCITATION CURRENT IN Y ALIGNMENT COIL |
|---|---|---|---|
| FRAME 1 | HV + V1, | X=ORG_X | Y=ORG_Y |
| FRAME 2 | HV + V2, | X=ORG_X | Y=ORG_Y |
| FRAME 3 | HV + V1, | X=ORG_X | Y=ORG_Y+AL1 |
| FRAME 4 | HV + V2, | X=ORG_X | Y=ORG_Y+AL1 |
| FRAME 5 | HV + V1, | X=ORG_X+AL1 | Y=ORG_Y |
| FRAME 6 | HV + V2, | X=ORG_X+AL1 | Y=ORG_Y |
| FRAME 7 | HV + V1, | X=ORG_X | Y=ORG_Y+AL2 |
| FRAME 8 | HV + V1, | X=ORG_X+AL2 | Y=ORG_Y |

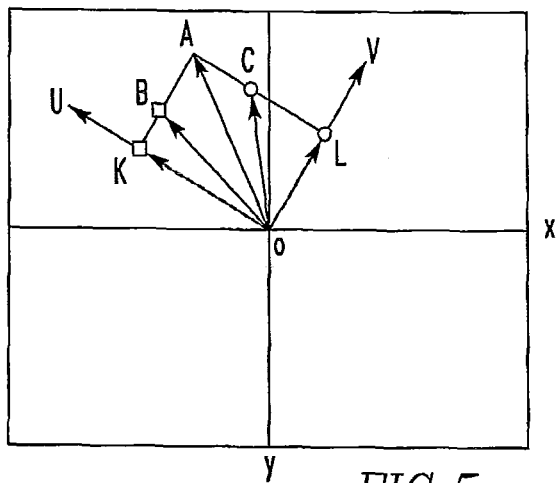
FIG.5
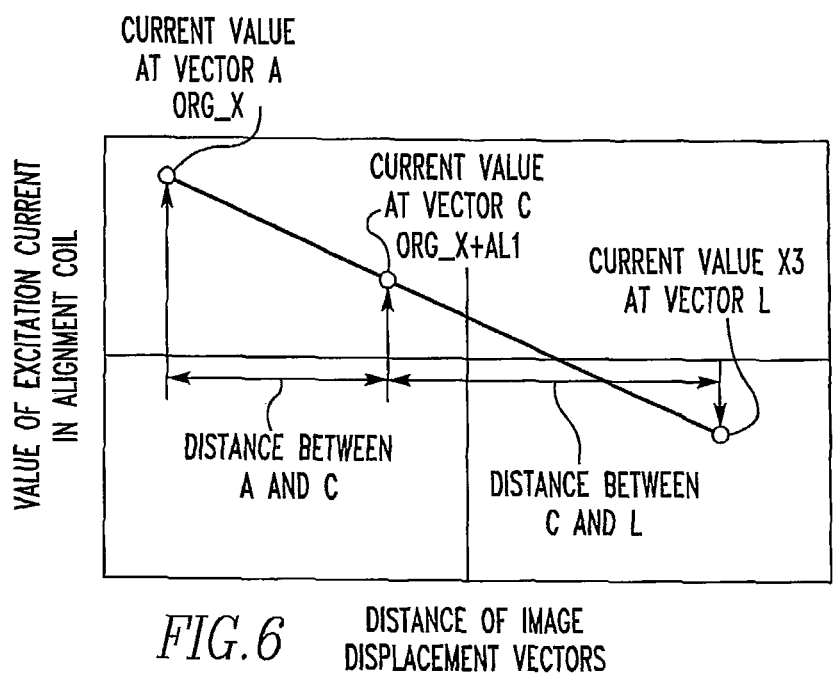
FIG.6  DISTANCE OF IMAGE DISPLACEMENT VECTORS

| FRAME | ACCELERATING VOLTAGE | VALUE OF EXCITATION CURRENT IN X ALIGNMENT COIL | VALUE OF EXCITATION CURRENT IN Y ALIGNMENT COIL |
|---|---|---|---|
| FRAME 1 | HV + V1, | X=ORG_X | Y=ORG_Y |
| FRAME 2 | HV + V1, | X=ORG_X | Y=ORG_Y+AL1 |
| FRAME 3 | HV + V1, | X=ORG_X+AL1 | Y=ORG_Y |
| FRAME 4 | HV + V1, | X=ORG_X | Y=ORG_Y−AL1 |
| FRAME 5 | HV + V1, | X=ORG_X−AL1 | Y=ORG_Y |

FIG.19

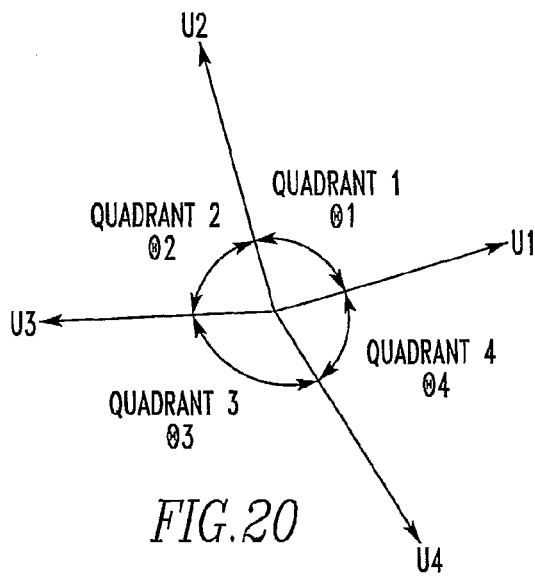

FIG.20

| FRAME | ACCELERATING VOLTAGE | VALUE OF EXCITATION CURRENT IN X ALIGNMENT COIL | VALUE OF EXCITATION CURRENT IN Y ALIGNMENT COIL |
|---|---|---|---|
| FRAME 6 | HV + V2, | X=ORG_X | Y=ORG_Y |
| FRAME 7 | HV + V2, | X=ORG_X | Y=ORG_Y+ALY |
| FRAME 8 | HV + V2, | X=ORG_X+ALX | Y=ORG_Y |

FIG.21

METHOD OF MAKING AXIAL ALIGNMENT OF CHARGED PARTICLE BEAM AND CHARGED PARTICLE BEAM SYSTEM

BACKGROUND OF THE INVENTION

1. Field of the Invention

The present invention relates to a method of making axial alignment of a charged particle beam and also to a charged particle beam system.

2. Description of Related Art

In recent years, charged particle beam systems including scanning electron microscopes for observing and measuring microscopic structures such as living organisms, materials, and semiconductors and metrology SEMs for measurements of circuit patterns of semiconductor devices have been known.

FIG. 31 is a block diagram showing one related art scanning electron microscope. The microscope, generally indicated by reference numeral 1000, has an electron gun 102 producing a charged particle beam B that is passed through an objective aperture 103. Then, the beam is focused on a surface of a sample S by an objective lens 106. When the beam B is scanned over the sample S by scan coils 107, secondary electrons and backscattered electrons are emitted from the surface of the sample S. These electrons are received by an electron detector 108. The intensity is displayed on an image display device 109 in synchronism with the beam scanning.

Axial alignment of the charged particle beam B with the objective aperture 103, an aperture angle correcting lens 105, and the objective lens 106 of the scanning electron microscope 1000 is made by controlling currents flowing through a beam axis alignment coil (hereinafter referred to as the X alignment coil) 104a and another beam axis alignment coil (hereinafter referred to as the Y-alignment coil) 104b which deflect the beam in the X-axis and Y-axis directions, respectively. The beam B can be deflected in two dimensions by combination of the alignment coils 104a and 104b. It is assumed here that the optical axis of the objective lens 106 lies in the Z-direction.

In particular, axial alignment of the charged particle beam B is made as follows. First, a signal is sent from a signal generator 110 for a wobbler to a high-voltage source 111 for producing an accelerating voltage to vary the accelerating voltage of the beam B in equal, small increments such that the focal state of the beam B on the surface of the sample S is varied minutely. If the optical axis deviates, the beam B crosses the objective lens 106 obliquely. Therefore, during execution of the wobbling motion, as shown in FIG. 32A, the image I is moved in a given direction when the focal state is being varied. On the other hand, if the optical axis is aligned, the beam B passes through the objective lens 106 vertically and, therefore, during the execution of wobbling motion, as shown in FIG. 32B, the image I hardly moves in spite of variation of the focal state. Accordingly, the values of the currents flowing through the alignment coils 104a and 104b can be adjusted to align the optical axis by manually adjusting XY adjustment knobs 112 to minimize the amount of motion of the image I while observing the amount of motion of the image I during the execution of wobbling motion. The adjustment knobs 112 include an X adjustment knob for adjusting the value of the current in the X alignment coil 104a and a Y adjustment knob for adjusting the value of the current in the Y alignment coil 104b. The values of the currents in the X alignment coil 104a and Y alignment coil 104b can be controlled via a driver amplifier 113 by manipulating the XY adjustment knobs 112. A wobbling motion can also be made by varying the exciting current in the objective lens 106, the current being supplied from an objective lens driver amplifier 115.

Methods of automating this axial alignment are disclosed, for example, in JP-A-7-302564, where an adjustment method of varying the axis in increments to obtain an optimum value for axial alignment and a method of determining the direction of an adjustment made to the axis according to the direction of image displacement in a case where the objective lens excitation is varied are presented.

In the above-described scanning electron microscope 1000 shown in FIG. 31, the resultant vector of the direction of axial deviation of the charged particle beam, the direction of deflection achieved by the X alignment coil 104a, and the direction of deflection achieved by the Y alignment coil 104b is intrinsically a vector representing the motion of the image at the wobbler. Therefore, if one of the X alignment coil 104a and Y alignment coil 104b is adjusted optimally, the image motion induced by the wobbler remains. Accordingly, if the X alignment coil 104a is adjusted first and inappropriately, it is impossible to find a point at which image motion does not occur however the Y alignment coil 104b is adjusted. In this way, the adjustment operation for searching for one point where no image motion occurs by adjusting the two alignment coils is not intuitively understandable for the operator of the instrument and places great burden on the operator.

In view of this problem, JP-A-7-302564 discloses an apparatus that automates the axial alignment. In the axial alignment method of this patent document, however, an operation needs to be performed repeatedly many times to find an optimum value for axial alignment.

SUMMARY OF THE INVENTION

In view of the foregoing problem, the present invention has been made. One object associated with some embodiments of the present invention is to provide a method of easily making axial alignment of a charged particle beam.

Another object associated with some embodiments of the invention is to provide a charged particle beam system that can easily make axial alignment of a charged particle beam.

(1) A method of making axial alignment of a charged particle beam in accordance with the present invention is implemented by a charged particle beam system which adjusts the axis of the beam by a first alignment coil for deflecting the beam in a first direction and a second alignment coil for deflecting the beam in a second direction crossing the first direction, irradiates a sample with the beam, detects a signal emanating from the sample, and obtains image data. The method includes: an image data acquisition step for obtaining at least first through sixth image data while varying acquisition conditions including the focal position of the beam on the sample in the direction of incidence, the excitation current in the first alignment coil, and the excitation current in the second alignment coil; and a computing step for calculating values of the exciting currents in the first and second alignment coils, respectively, for the axial alignment of the beam from the at least first through sixth image data obtained by the image data acquisition step.

During the image data acquisition step, the first image data is obtained under conditions where the focal position is a first position, the value of the excitation current in the first alignment coil is a first electric current value, and the value of the excitation current in the second alignment coil is a second electric current value. The second image data is obtained under conditions where the focal position is a second position, the value of the excitation current in the first alignment coil is the first electric current value, and the value of the excitation current in the second alignment coil is the second electric current value. The third image data is obtained under conditions where the focal position is the first position, the value of the excitation current in the first alignment coil is the first electric current value, and the value of the excitation current in the second alignment coil is an electric current value obtained by varying the second electric current value by a first incremental current value. The fourth image data is obtained under conditions where the focal position is the second position, the value of the excitation current in the first alignment coil is the first electric current value, and the value of the excitation current in the second alignment coil is an electric current value obtained by varying the second electric current value by the first incremental current value. The fifth image data is obtained under conditions where the focal position is the first position, the value of the excitation current in the first alignment coil is an electric current value obtained by varying the first electric current value by the first incremental current value, and the value of the excitation current in the second alignment coil is the second electric current value. The sixth image data is obtained under conditions where the focal position is the second position, the value of the excitation current in the first alignment coil is an electric current value obtained by varying the first electric current value by the first incremental current value, and the value of the excitation current in the second alignment coil is the second electric current value.

This method of making axial alignment of the charged particle beam makes it possible to find values of the excitation currents in the first and second alignment coils, respectively, which are used for axial alignment of the beam from the first through sixth image data. Since the number of image data required to be obtained for axial alignment of the beam is small in this way, it is easy to make axial alignment of the beam. Accordingly, the burden on the operator of the system can be alleviated. The time taken to make axial alignment of the beam can be shortened.

(2) In one aspect of the method of making axial alignment as set forth in (1) above, during the computing step, a first image displacement vector indicating the amount of positional deviation between the first image data and second image data, a second image displacement vector indicating the amount of positional deviation between the third image data and the fourth image data, and a third image displacement vector indicating the amount of positional deviation between the fifth image data and the sixth image data are calculated. The values of the excitation currents in the first and second alignment coils, respectively, for the axial alignment of the charged particle beam may be calculated from the first through third image displacement vectors.

(3) In one aspect of the method of making axial alignment as set forth in (2) above, during the image data acquisition step, seventh image data and eighth image data are also obtained. The seventh image data is obtained under conditions where the focal position is the first position, the value of the excitation current in the first alignment coil is the first electric current value, and the value of the excitation current in the second alignment coil is an electric current value obtained by varying the second electric current value by a second incremental current value. The eighth image data is obtained under conditions where the focal position is the first position, the value of the excitation current in the first alignment coil is an electric current value obtained by varying the first electric current value by the second incremental current value, and the value of the excitation current in the second alignment coil is the second electric current value.

(4) In one aspect of the method of making axial alignment as set forth in (3) above, during the computing step, a fourth image displacement vector indicating the amount of positional deviation between the first image data and the seventh image data and a fifth image displacement vector indicating the amount of positional deviation between the first image data and the eighth image data are also calculated. The values of the excitation currents in the first and second alignment coils, respectively, for the axial alignment of the charged particle beam may be calculated from the first through fifth image displacement vectors.

The method of making axial alignment of the charged particle beam described so far can alleviate the shooting conditions under which image data are obtained while enhancing the computational accuracy.

(5) In one aspect of the method of making axial alignment as set forth in (2) above, during the computing step, a fourth image displacement vector indicating the amount of positional deviation between the first image data and the third image data and a fifth image displacement vector indicating the amount of positional deviation between the first image data and the fifth image data are also calculated. The values of the excitation currents in the first and second alignment coils, respectively, for the axial alignment of the charged particle beam may be calculated from the first through fifth image displacement vectors.

This method of making axial alignment of the charged particle beam makes it possible to find values of the excitation currents in the first and second alignment coils, respectively, which are used for axial alignment of the beam from the first through sixth image data. Since the number of image data required to be obtained for axial alignment of the beam is small in this way, it is easy to make axial alignment of the beam. Accordingly, the burden on the operator of the system can be alleviated. The time taken to make axial alignment of the beam can be shortened.

(6) A charged particle beam system associated with the present invention adjusts the axis of a charged particle beam by a first alignment coil for deflecting the beam in a first direction and a second alignment coil for deflecting the beam in a second direction crossing the first direction, irradiates a sample with the beam, detects a signal emanating from the sample, and obtains image data. The charged particle beam system includes: image data acquisition means for obtaining at least first through sixth image data while varying acquisition conditions including the focal position of the beam on the sample in the direction of incidence and excitation currents in the first and second alignment coils, respectively; and computing means for calculating values of the excitation currents in the first and second alignment coils, respectively, for the axial alignment of the beam from the at least first through sixth image data obtained by the image data acquisition means. The first image data is obtained under conditions where the focal position is a first position, the value of the excitation current in the first alignment coil is a first electric current value, and the value of the excitation current in the second alignment coil is a second electric current value. The second image data is obtained under conditions where the focal position is a second position, the value of the excitation current in the first alignment coil is the first electric current value, and the value of the excitation current in the second alignment coil is the second electric current value. The third image data is obtained under conditions where the focal position is the first position, the value of the excitation current in the first alignment coil is the first electric current value, and the value of the excitation current in the second alignment coil is an electric current value obtained by varying the second electric current value by a first incremental current value. The fourth image data is obtained under conditions where the focal position is the second position, the value of the excitation current in the first alignment coil is the first electric current value, and the value of the excitation current in the second alignment coil is an electric current value obtained by varying the second electric current value by the first incremental current value. The fifth image data is obtained under conditions where the focal position is the first position, the value of the excitation current in the first alignment coil is an electric current value obtained by varying the first electric current value by the first incremental current value, and the value of the excitation current in the second alignment coil is the second electric current value. The sixth image data is obtained under conditions where the focal position is the second position, the value of the excitation current in the first alignment coil is an electric current value obtained by varying the first electric current value by the first incremental current value, and the value of the excitation current in the second alignment coil is the second electric current value.

This charged particle beam system makes it possible to find values of the excitation currents in the first and second alignment coils, respectively, which are used for axial alignment of the beam from the first through sixth image data. Since the number of image data required to be obtained for the axial alignment of the beam is small in this way, it is easy to make axial alignment of the beam. Accordingly, the burden on the operator of the system can be alleviated. The time taken to make axial alignment of the beam can be shortened.

(7) In one aspect of the charged particle beam system as set forth in (6) above, the computing means calculates a first image displacement vector indicating the amount of positional deviation between the first image data and second image data, a second image displacement vector indicating the amount of positional deviation between the third image data and the fourth image data, and a third image displacement vector indicating the amount of positional deviation between the fifth image data and the sixth image data. The values of the excitation currents in the first and second alignment coils, respectively, for the axial alignment of the charged particle beam may be calculated from the first through third image displacement vectors.

(8) In one feature of the charged particle beam system as set forth in (7) above, the image data acquisition means further obtains seventh image data and eighth image data. The seventh image data is obtained under conditions where the focal position is the first position, the value of the excitation current in the first alignment coil is the first electric current value, and the value of the excitation current in the second alignment coil is an electric current value obtained by varying the second electric current value by a second incremental current value. The eighth image data may be obtained under conditions where the focal position is the first position, the value of the excitation current in the first alignment coil is an electric current value obtained by varying the first electric current value by the second incremental current value, and the value of the excitation current in the second alignment coil is the second electric current value.

(9) In one feature of the charged particle beam system as set forth in (8) above, the computing means further calculates a fourth image displacement vector indicating the amount of positional deviation between the first image data and the seventh image data and a fifth image displacement vector indicating the amount of positional deviation between the first image data and the eighth image data. The values of the excitation currents in the first and second alignment coils, respectively, for the axial alignment of the charged particle beam may be calculated from the first through fifth image displacement vectors.

According to the charged particle beam system designed as described so far, the shooting conditions under which image data are obtained can be alleviated while enhancing the computational accuracy.

(10) In one feature of the charged particle beam system as set forth in (7) above, the computing means further calculates a fourth image displacement vector indicating the amount of positional deviation between the first image data and the third image data and a fifth image displacement vector indicating the amount of positional deviation between the first image data and the fifth image data. The values of the excitation currents in the first and second alignment coils, respectively, for the axial alignment of the charged particle beam may be calculated from the first through fifth image displacement vectors.

This charged particle beam system makes it possible to find values of the excitation currents in the first and second alignment coils, respectively, which are used for axial alignment of the beam from the first through sixth image data. Since the number of image data required to be obtained for axial alignment of the beam is small in this way, it is easy to make axial alignment of the beam. Accordingly, the burden on the operator of the system can be alleviated. The time taken to make axial alignment of the beam can be shortened.

(11) In one feature of the charged particle beam system as set forth in any one of (6)-(10) above, the image data acquisition means may control the focal position by controlling at least one of the accelerating voltages of a beam source producing the charged particle beam and the value of the excitation current in an objective lens.

(12) In one feature of the method of making axial alignment of a charged particle beam as set forth in any one of (2)-(5) above, during the computing step, a decision is made as to whether the calculated first through third displacement vectors are used to calculate the values of the excitation currents in the first and second alignment coils, respectively. If the decision is that the first through third image displacement vectors are not used for the calculations, at least one of magnification and field of view is varied and the first through sixth image data may again be obtained.

According to this method of making axial alignment of the charged particle beam, misalignment of the beam can be made smaller than prior to the alignment of the beam.

(13) In one feature of the method of making axial alignment as set forth in (4) above, during the computing step, a decision is made as to whether the calculated fourth and fifth image displacement vectors are used to calculate the values of the excitation currents in the first and second alignment coils, respectively. If the decision is that the fourth and fifth image displacement vectors are not used for the calculations, at least one of magnification and field of view is varied and the first through sixth image data may be again obtained.

According to this method of making axial alignment of the charged particle beam, misalignment of the beam can be made smaller than prior to the alignment of the beam.

(14) In one feature of the method of making axial alignment as set forth in any one of (2)-(5) above, there are further provided the steps of: obtaining two image data under conditions in which the values of the excitation currents in the first and second alignment coils, respectively, are calculated by said computing step and in which the two image data are obtained at different values of the focal position; calculating a sixth image displacement vector from these two image data; and making a second decision as to whether or not the sixth image displacement vector is greater in magnitude than the first image displacement vector.

If the second decision is that the sixth image displacement vector is greater in magnitude than the first image displacement vector, at least one of magnification and field of view is varied and the first through sixth image data may be again obtained.

According to this method of making axial alignment of the charged particle beam, the axis of the beam can be prevented from being more misaligned than prior to the axial alignment of the beam.

(15) A method of making axial alignment of a charged particle beam in accordance with the present invention is implemented in a charged particle beam system in which the axis of the beam is adjusted by a first alignment coil for deflecting the beam in a first direction and a second alignment coil for deflecting the beam in a second direction crossing the first direction. The system irradiates a sample with the beam, detects a signal emanating from the sample, and obtains image data. This method starts with obtaining first through fifth image data under conditions where a focal position of the beam on the sample in the direction of incidence, the exciting current in the first alignment coil, and the excitation current in the second alignment coil are varied. This step may be hereinafter referred to as the first image data acquisition step. Then, sixth image data is obtained. This step may be hereinafter referred to as the second image data acquisition step. Subsequently, first through fourth image displacement vectors are calculated from the first through fifth image data. This step may be hereinafter referred to as the first computing step. Thereafter, acquisition conditions under which seventh and eighth image data are obtained are determined, based on the first through fourth image displacement vectors. This step may be hereinafter referred to as the image acquisition condition determining step. The seventh and eighth image data are obtained based on the acquisition conditions determined by the image acquisition condition determining step. This step may be hereinafter referred to as the third image data acquisition step. The values of the excitation currents in the first and second alignment coils, respectively, for the axial alignment of the beam are calculated from the first through eighth image data obtained by the first through third image data acquisition steps. This step may be hereinafter referred to as the second computing step.

During the first image data acquisition step, the first image data is obtained under conditions where the focal position is a first position, the value of the excitation current in the first alignment coil is a first electric current value, and the value of the excitation current in the second alignment coil is a second electric current value. The second image data is obtained under conditions where the focal position is the first position, the value of the excitation current in the first alignment coil is the first electric current value, and the value of the excitation current in the second alignment coil is an electric current value obtained by incrementing the second electric current value by a first incremental current value. The third image data is obtained under conditions where the focal position is the first position, the value of the excitation current in the first alignment coil is an electric current value obtained by incrementing the first electric current value by the first incremental current value, and the value of the excitation current in the second alignment coil is the second electric current value. The fourth image data is obtained under conditions where the focal position is the first position, the value of the excitation current in the first alignment coil is the first electric current value, and the value of the excitation current in the second alignment coil is an electric current value obtained by decrementing the second electric current value by the first incremental current value. The fifth image data is obtained under conditions where the focal position is the first position, the value of the excitation current in the first alignment coil is an electric current value obtained by decrementing the first electric current value by the first incremental current value, and the value of the excitation current in the second alignment coil is the second electric current value.

During the second image data acquisition step, the sixth image data is obtained under conditions where the focal position is a second position, the value of the excitation current in the first alignment coil is the first electric current value, and the value of the excitation current in the second alignment coil is the second electric current value.

During the first computing step, the first image displacement vector indicating the amount of positional deviation between the first image data and the third image data, the second image displacement vector indicating the amount of positional deviation between the first image data and the second image data, the third image displacement vector indicating the amount of positional deviation between the first image data and the fifth image data, and the fourth image displacement vector indicating the amount of positional deviation between the first image data and the fourth image data are calculated.

During the image acquisition condition determining step, two adjacent vectors of the set are selected based on given conditions from the first through fourth image displacement vectors to thereby determine the values of the excitation currents in the second and first alignment coils, respectively, for the seventh and eighth image data, respectively.

During the third image data acquisition step, the seventh image data is obtained under conditions where the focal position is the second position, the value of the excitation current in the first alignment coil is the first electric current value, and the value of the excitation current in the second alignment coil is an electric current value determined by the image acquisition condition determining step. The eighth image data is obtained under conditions where the focal position is the second position, the value of the excitation current in the first alignment coil is an electric current value determined by the image acquisition condition determining step, and the value of the excitation current in the second alignment coil is the second electric current value.

According to this axial alignment method for a charged particle beam, the values of the excitation currents in the first and second alignment coils, respectively, for axial alignment of the beam can be found from the first through eighth image data. Since the number of image data required to be obtained for axial alignment of the beam can be made small in this way, it is easy to make axial alignment of the beam. Consequently, the burden on the operator of the system can be alleviated. The time taken to make axial alignment of the beam can be shortened.

Furthermore, according to this axial alignment method for a charged particle beam, the accuracy at which the values of the excitation currents in the first and second alignment coils, respectively, are computed can be improved.

(16) In one feature of the method of making axial alignment as set forth in (15) above, during the image acquisition condition determining step, two adjacent angles of the set which make an angle closest to the angle made between said first direction and said second direction among sets of the first through fourth image displacement vectors are selected from these sets.

(17) In another feature of the method of making axial alignment as set forth in (15) above, during the image acquisition condition determining step, said set may be selected from the sets of the first through fourth image displacement vectors based on the sum of the magnitudes of the two adjacent vectors of the set.

(18) In a further feature of the method of making axial alignment as set forth in any one of (16) and (17) above, during the second computing step, one of the second image data and the fourth image data may be selected and one of the third image data and the fifth image data may be selected based on the selected set. A fifth image displacement vector indicating the amount of positional deviation between the first image data and the sixth image data, a sixth image displacement vector indicating the amount of positional deviation between selected one of the second and fourth image data and the seventh image data, and a seventh image displacement vector indicating the amount of positional deviation between the selected one of the third and fifth image data and the eighth image data are calculated. The values of the excitation currents in the first and second alignment coils, respectively, for the axial alignment of the beam may be calculated from the first through seventh image displacement vectors.

(19) Another charged particle beam system associated with the present invention adjusts the axis of a charged particle beam by a first alignment coil for deflecting the beam in a first direction and a second alignment coil for deflecting the beam in a second direction crossing the first direction, irradiates a sample with the beam, detects a signal emanating from the sample, and obtains image data. The charged particle beam system has: image data acquisition means for obtaining first through eighth image data while varying acquisition conditions including a focal position of the beam on the sample in the direction of incidence and the excitation currents in the first and second alignment coils, respectively; image acquisition condition determining means for determining acquisition conditions under which the seventh and eighth image data are obtained based on the first through fifth image data obtained by the image data acquisition means; and computing means for calculating values of the excitation currents in the first and second alignment coils, respectively, for the axial alignment of the beam from the first through eighth image data obtained by the image data acquisition means. The first image data is obtained under conditions where the focal position is a first position, the value of the excitation current in the first alignment coil is a first electric current value, and the value of the excitation current in the second alignment coil is a second electric current value. The second image data is obtained under conditions where the focal position is the first position, the value of the excitation current in the first alignment coil is the first electric current value, and the value of the excitation current in the second alignment coil is an electric current value obtained by incrementing the second electric current value by a first incremental current value. The third image data is obtained under conditions where the focal position is the first position, the value of the excitation current in the first alignment coil is an electric current value obtained by incrementing the first electric current value by the first incremental current value, and the value of the excitation current in the second alignment coil is the second electric current value. The fourth image data is obtained under conditions where the focal position is the first position, the value of the excitation current in the first alignment coil is the first electric current value, and the value of the excitation current in the second alignment coil is an electric current value obtained by decrementing the second electric current value by the first incremental current value. The fifth image data is obtained under conditions where the focal position is the first position, the value of the excitation current in the first alignment coil is an electric current value obtained by decrementing the first electric current value by the first incremental current value, and the value of the excitation current in the second alignment coil is the second electric current value. The sixth image data is obtained under conditions where the focal position is a second position, the value of the excitation current in the first alignment coil is the first electric current value, and the value of the excitation current in the second alignment coil is the second electric current value. The seventh image data is obtained under conditions where the focal position is the second position, the value of the excitation current in the first alignment coil is the first electric current value, and the value of the excitation current in the second alignment coil is an electric current value determined by the image acquisition condition determining means. The eighth image data is obtained under conditions where the focal position is the second position, the value of the excitation current in the first alignment coil is an electric current value determined by the image acquisition condition determining means, and the value of the excitation current in the second alignment coil is the second electric current value.

The computing means calculates a first image displacement vector indicating the amount of positional deviation between the first image data and the third image data, a second image displacement vector indicating the amount of positional deviation between the first image data and the second image data, a third image displacement vector indicating the amount of positional deviation between the first image data and the fifth image data, and a fourth image displacement vector indicating the amount of positional deviation between the first image data and the fourth image data.

The image acquisition condition determining means selects two adjacent vectors of the set from the first through fourth image displacement vectors based on given conditions to thereby determine the values of the excitation currents in the second and first alignment coils, respectively, for the seventh and eighth image data, respectively.

According to this charged particle beam system, the values of the excitation currents flowing through the first and second alignment coils, respectively, for axial alignment of the beam can be found from the first through eighth image data. Since the number of image data required to be obtained for axial alignment of the beam is small in this way, it is easy to make axial alignment of the beam. Consequently, the burden on the operator of the system can be alleviated. The time taken to make axial alignment of the beam can be reduced.

Furthermore, according to this charged particle beam system, the accuracy at which the values of the excitation currents in the first and second alignment coils, respectively, are computed can be improved.

(20) In one feature of the charged particle beam system set forth in (19) above, the image acquisition condition determining means may select the two adjacent vectors of the set which make an angle closest to the angle made between the first direction and the second direction among the sets of the first through fourth image displacement vectors from these sets.

(21) In another feature of the charged particle beam system as set forth in (19) above, the image acquisition condition determining means may select the set from the sets of the first through fourth image displacement vectors based on the sum of the magnitudes of the two adjacent vectors of the set.

(22) In one feature of the charged particle beam system as set forth in any one of (20) and (21) above, the computing means may select one of the second image data and the fourth image data and select one of the third image data and the fifth image data based on the selected set. The computing means may calculate a fifth image displacement vector indicating the amount of positional deviation between the first image data and the sixth image data, a sixth image displacement vector indicating the amount of positional deviation between the selected one of the second image data and the fourth image data and the seventh image data, and a seventh image displacement vector indicating the amount of positional deviation between the selected one of the third image data and the fifth image data and the eighth image data. The computing means may calculate the values of the excitation currents in the first and second alignment coils, respectively, for the axial alignment of the beam from the first through seventh image displacement vectors.

(23) In one feature of the method of making axial alignment as set forth in any one of (2)-(5) and (12)-(18), there is further provided a first decision step of making a first decision as to whether or not an image displacement vector calculated from two image data which are different only in the focal position is greater than a given value. If the first decision is that the image displacement vector is greater than the given value, the values of the excitation currents in the first and second alignment coils, respectively, for the axial alignment of the beam may be calculated.

According to this method of making axial alignment of the charged particle beam, misalignment of the beam can be made smaller than prior to the alignment of the beam.

BRIEF DESCRIPTION OF THE DRAWINGS

FIG. 5 is a diagram illustrating the relationship among first through fifth image displacement vectors associated with the first embodiment;

FIG. 6 is a diagram illustrating the relationships among the distances of image displacement vectors A, C, and L and values of excitation currents in alignment coils;

FIG. 19 is a table illustrating shooting conditions under which frames 1-5 are taken;

FIG. 20 is a diagram illustrating the relationships among first through fourth image displacement vectors;

FIG. 21 is a table illustrating shooting conditions under which frames 6-8 are taken;

DESCRIPTION OF THE PREFERRED EMBODIMENTS

The preferred embodiments of the present invention are hereinafter described in detail with reference to the drawings. It is to be understood that the embodiments described hereinafter do not unduly restrict the contents of the invention delineated by the claims and that all of the configurations described below are not always the essential components of the invention.

1. First Embodiment 1.1. Configuration of Charged Particle Beam System

Figure 1:
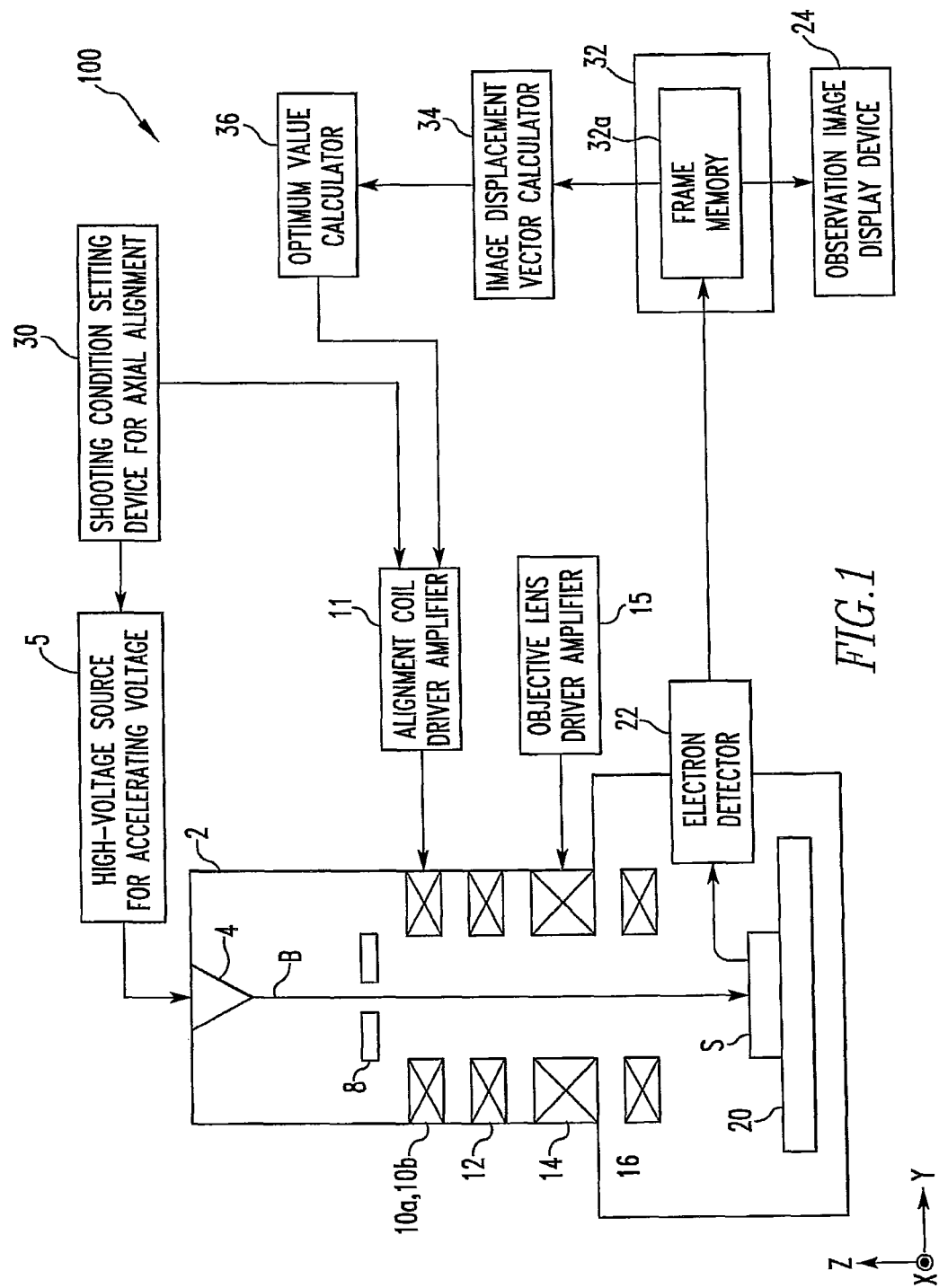
FIG. 1 is a block diagram illustrating the configuration of a charged particle beam system associated with a first embodiment of the present invention.

First, the configuration of a charged particle beam system associated with the present embodiment is described by referring to FIG. 1. The system is generally indicated by reference numeral 100 and is a scanning electron microscope (SEM).

As shown in FIG. 1, the charged particle beam system 100 includes a charged particle beam source 4, a high-voltage source 5 for producing an accelerating voltage, an objective aperture 8, a first alignment coil 10a, a second alignment coil 10b, an alignment coil driver amplifier 11, an aperture angle correcting lens 12, an objective lens 14, an objective lens driver amplifier 15, scan coils 16, a sample stage 20, an electron detector 22, an observed image display device 24, a shooting condition setting device 30 for axial alignment, a storage device 32 (including a frame memory 32a), an image displacement vector calculator 34, and an optimum value calculator 36.

For example, the charged particle beam source 4 is a well-known electron gun that accelerates, by an anode, electrons released from a cathode and releases a charged particle beam (electron beam) B.

The high-voltage source 5 applies the accelerating voltage to the charged particle beam source 4 to accelerate the electrons released from the cathode.

The objective aperture 8 passes only those portions of the beam B incident on the objective lens 14 which are close to the optical axis and blocks off the other portions.

The first alignment coil (X alignment coil) 10a and the second alignment coil (Y alignment coil) 10b can adjust the axis of the beam B. The X alignment coil 10a has coil elements of a set which are opposite to each other in the X direction, and can deflect the beam B in the X direction (first direction). The Y alignment coil 10b has coil elements of a set which are opposite to each other in a second direction (Y direction) crossing the X direction perpendicularly or non-perpendicularly, and can deflect the beam B in the Y direction. That is, the beam B can be deflected in two dimensions by the X alignment coil 10a and Y alignment coil 10b. As an example, the Z direction is along the optical axis of the objective lens 14. Excitation currents in the alignment coils 10a and 10b are supplied from the alignment coil driver amplifier 11. The deflection of the beam B within a charged particle beam column 2 can be controlled in two dimensions by controlling the excitation currents flowing through the alignment coils 10a and 10b.

The direction of deflection made by the X alignment coil 10a relative to the beam B and the direction of deflection made by the Y alignment coil 10b do not need to be orthogonal to each other, as long as the beam B can be deflected in two dimensions.

The aperture angle correcting lens 12 is capable of correcting the aperture angle of the charged particle beam B.

The objective lens 14 focuses the beam B onto a surface of a sample S. The objective lens 14 is connected with the objective lens driver amplifier 15. The excitation current in the objective lens 14 is supplied from the objective lens driver amplifier 15.

The scan coils 16 are solenoid coils for scanning the beam B over the sample S.

The sample stage 20 supports the sample S and can move it horizontally, up and down, rotate it, and tilt it.

The charged particle beam source 4, objective aperture 8, first alignment coil 10a, second alignment coil 10b, aperture angle correcting lens 12, objective lens 14, and scan coils 16 are housed in the charged particle beam column 2.

The electron detector 22 detects secondary electrons or backscattered electrons released from the surface of the sample S in response to the scanning of the focused beam B. A signal produced from the detector 22 and indicating the intensity of the secondary electrons or backscattered electrons is stored as image data synchronized with the scanning signal for the beam B into the frame memory 32a. During the scanning of the beam B, excitation currents based on the scanning signal are supplied to the scan coils 16.

The storage device 32 has the frame memory 32a for storing image data. The storage device 32 may further store shooting conditions under which image data are taken.

The image display device 24 displays an SEM image based on the image data stored in the frame memory 32a.

The shooting condition setting device 30 for axial alignment can acquire image data while varying acquisition conditions including the focus of the beam B transmitted through the objective lens 14 and through the scan coils 16 and the excitation currents in the alignment coils 10a, 10b. The setting device 30 can obtain plural sets of image data while varying the shooting conditions by controlling the accelerating voltage of the charged particle beam source 4 and the excitation currents in the alignment coils 10a and 10b and store the image data and shooting conditions in the storage device 32. The setting device 30 is connected with the high-voltage source 5 for accelerating voltage and controls the accelerating voltage via the high-voltage source 5. Consequently, the focal position of the beam B transmitted through the objective lens 14 and scan coils 16 can be controlled. As a result, the focal position of the beam B that is located over the sample S and is traveling toward the sample is controlled in the direction of incidence. The setting device 30 is connected with the alignment coil driver amplifier 11 and controls the excitation currents in the alignment coils 10a and 10b via the driver amplifier 11.

The image displacement vector calculator 34 and optimum value calculator 36 each of which is one example of computing means calculate the values of the excitation currents in the first alignment coil 10a and the second alignment coil 10b for axial alignment of the charged particle beam B from the image data stored in the frame memory 32a. The values of the excitation currents are output to the alignment coil driver amplifier 11 from the optimum value calculator 36.

1.2. Operation of Charged Particle Beam System

The operation of the charged particle beam system 100 associated with the first embodiment is next described.

Figures 2, 3:
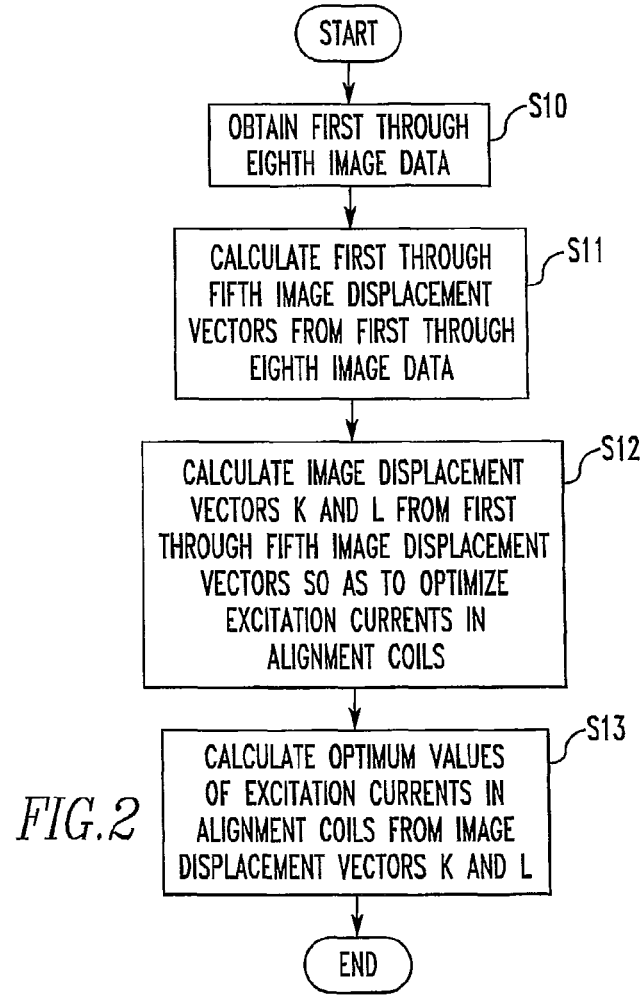
FIG. 2 is a flowchart illustrating a sequence of steps for making axial alignment of a charged particle beam, the steps being associated with the first embodiment.
FIG. 3 is a table showing shooting conditions under which frames 1-8 are taken.

FIG. 2 is a flowchart illustrating a sequence of steps for making axial alignment by the charged particle beam system 100 associated with the present embodiment.

First, first through eighth image data are obtained by the use of the shooting condition setting device 30 for axial alignment (S10). This step is referred to as the image data acquisition step. The setting device 30 obtains the first through eighth image data by taking frames 1-8 while varying acquisition conditions such as accelerating voltage, excitation current in the X alignment coil 10a, and excitation current in the Y alignment coil 10b. The frames 1-8 taken by the setting device 30 are stored as first through eighth image data into the frame memory 32a. Furthermore, the shooting conditions under which the frames 1-8 (first through eighth image data) were taken are stored in the storage device 32.

FIG. 3 is a table showing the shooting conditions under which frames are taken. The shooting conditions include accelerating voltage, value of the excitation current in the X alignment coil, and value of the excitation current in the Y alignment coil. The frame 1 is taken under conditions HV+V1, X=ORG_X, and Y=ORG_Y. The frame 2 is taken under conditions HV+V2, X=ORG_X, and Y=ORG_Y. The frame 3 is taken under conditions HV+V1, X=ORG_X, and Y=ORG_Y+AL1. The frame 4 is taken under conditions HV+V2, X=ORG_X, and Y=ORG_Y+AL1. The frame 5 is taken under conditions HV+V1, X=ORG_X+AL1, and Y=ORG_Y. The frame 6 is taken under conditions HV+V2, X=ORG_X+AL1, and Y=ORG_Y. The frame 7 is taken under conditions HV+V1, X=ORG_X, and Y=ORG_Y+AL2. The frame 8 is taken under conditions HV+V1, X=ORG_X+AL2, and Y=ORG_Y.

HV is the accelerating voltage used when an axial alignment operation is started. V1 and V2 are incremental amounts by which the accelerating voltage is varied. That is, in the frames 1-8, the focal position of the charged particle beam B transmitted through the objective lens 14 and scan coils 16 is any one of a first position assumed when the accelerating voltage is HV+V1 and a second position assumed when the accelerating voltage is HV+V2. The first current value ORG_X is the initial value of the excitation current in the X alignment coil 10a at the beginning of the axial alignment operation. The second current value ORG_Y is the initial value of the excitation current in the Y alignment coil 10b at the beginning of the axial alignment operation. AL1 and AL2 are incremental current values by which the current values in the alignment coils 10a and 10b are incremented or decremented. The incremental or decremental amount AL1 is different from the incremental or decremental amount AL2. In the present embodiment, when the accelerating voltage HV=10 kV, for example, it is assumed that the incremental amount V1=−50 V and the incremental amount V2=+50 V. Furthermore, when the value of excitation current ORG_X=10 mA and the value of excitation current ORG_Y=20 mA, it is assumed that AL1=−10 mA and AL2=+10 mA. No restrictions are imposed on these values if image displacement vectors are found normally in later processing steps (described later).

Computing steps S11-S13 for calculating the values of the excitation currents in the X alignment coil 10a and Y alignment coil 10b for axial alignment of the charged particle beam B from the first through eighth image data are next performed. The computing steps are described below.

First, first through fifth image displacement vectors are calculated from the first through eighth image data by the image displacement vector calculator 34 (S11).

FIGS. 4A-4E illustrate the image displacement vectors. In FIGS. 4A-4E, two corresponding frames of the frames 1-8 are shown to overlap each other. As shown in FIGS. 4A-4E, the image displacement vector calculator 34 combines 8 image data obtained by the shooting condition setting device 30 for axial alignment to compute first through fifth image displacement vectors A, B, C, V, and U.

Figure 4:
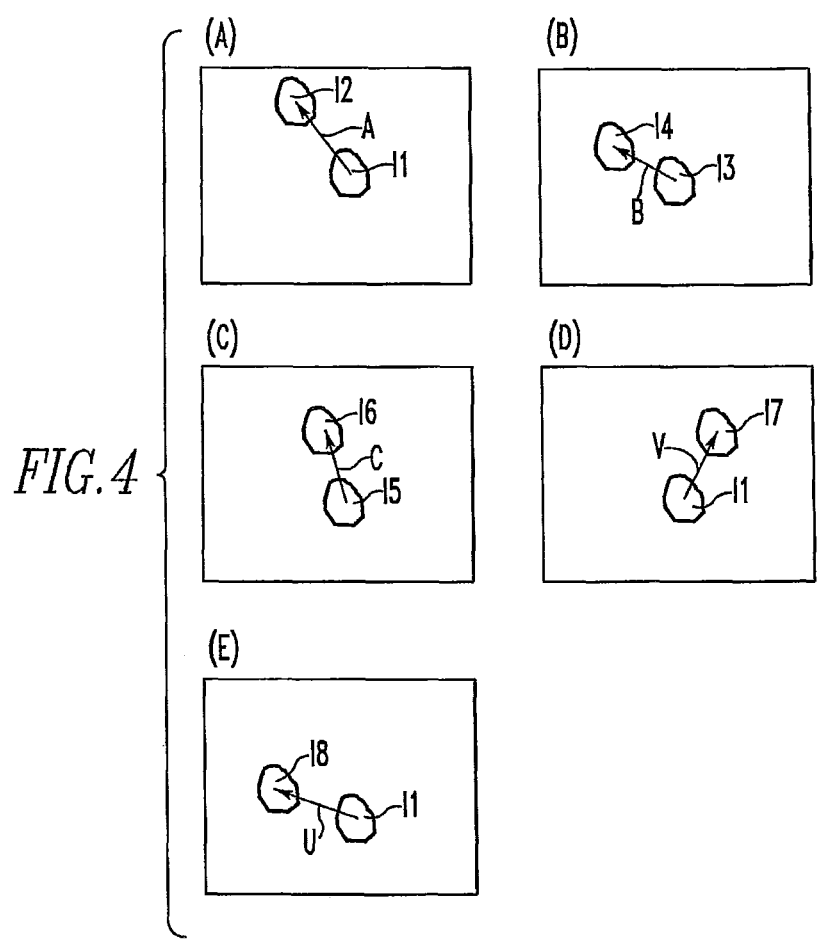
FIG. 4 illustrates image displacement vectors.

Specifically, as shown in FIG. 4A, the first image displacement vector A (a, b) indicating a motion of an image caused by a variation in the accelerating voltage when the excitation currents in the alignment coils 10a and 10b are at their initial values is calculated from the amount of positional deviation between the frame 1 (first image data) and the frame 2 (second image data).

As shown in FIG. 4B, the second image displacement vector B (c, d) indicating a motion of an image caused by a variation in the accelerating voltage when the excitation current in the Y alignment coil 10b is varied by the incremental or decremental amount AL1 is calculated from the amount of positional deviation between the frame 3 (third image data) and the frame 4 (fourth image data).

As shown in FIG. 4C, the third image displacement vector C (e, f) indicating a motion of an image caused by a variation in the accelerating voltage when the excitation current in the X alignment coil 10a is varied by the incremental or decremental amount AL1 is calculated from the amount of positional deviation between the frame 5 (fifth image data) and the frame 6 (sixth image data).

As shown in FIG. 4D, the fourth image displacement vector V (q, r) indicating the direction of deflection made by the Y alignment coil 10b is calculated from the amount of positional deviation between the frame 1 (first image data) and the frame 7 (seventh image data).

As shown in FIG. 4E, the fifth image displacement vector U (m, n) indicating the direction of deflection made by the X alignment coil 10a is calculated from the amount of positional deviation between the frame 1 (first image data) and the frame 8 (eighth image data).

An image displacement vector referred to herein is a vector indicating the amount of positional deviation of an image between two frames. For example, as shown in FIG. 4A, the first image displacement vector A can be computed from the amount of positional deviation (direction and magnitude) between an image I1 of the frame 1 and an image I2 of the frame 2. Similarly, as shown in FIGS. 4B-4E, the image displacement vectors B, C, V, and U can be calculated from the amounts of positional deviations between images I1 to I8 of the frames 1-8.

One example of the method of calculating the image displacement vectors A, B, C, V, and U is block matching using calculation of the cross-correlation between two images. The calculation of the cross-correlation is carried out by inverse Fourier transform of the product of the complex conjugates of two-dimensional Fourier transforms of two images. The coordinates of a maximum value of the result of the calculation of the two-dimensional cross-correlation give a displacement vector of an image.

FIG. 5 is a diagram illustrating the relationships among the first through fifth image displacement vectors. The lateral axis x indicates an x-component in an image displacement vector coordinate system. The vertical axis y indicates a y-component in the coordinate system. It is now assumed that when (x, y)=(0, 0), the values of the excitation currents in the alignment coils 10a and 10b are optimized.

The optimum value calculator 36 calculates image displacement vectors K and L at a position at which the excitation currents in the alignment coils 10a and 10b are optimized from the first through fifth image displacement vectors A, B, C, V, and U (S12).

The optimum value calculator 36 calculates the image displacement vectors L (s, t) and K (g, h) (FIG. 5) at points at which the excitation currents in the X alignment coil 10a and Y alignment coil 10b, respectively, are estimated to be optimal.

The point at which the excitation current in the X alignment coil 10a is estimated to be optimal is a coordinate point in the image displacement vector system at which the value of the excitation current in the X alignment coil 10a assumes an optimum value X3 (i.e., the value of the excitation current in the X alignment coil when the axis of the charged particle beam is aligned in the X-direction). That is, the point at which the excitation current in the X alignment coil 10a is estimated to be optimal is the intersection point L of the straight line AC and an axis indicated by the image displacement vector V, the line AC passing through a coordinate point A of the first image displacement vector A and a coordinate point C of the third image displacement vector C in the image displacement vector coordinate system as shown in FIG. 5. The point at which the excitation current in the Y alignment coil 10b is estimated to be optimal is a point in the image displacement vector coordinate system at which the value of the excitation current in the Y alignment coil 10b assumes an optimum value Y3 (i.e., the value of the excitation current in the Y alignment coil when the axis of the beam is aligned in the Y direction). That is, the point at which the excitation current in the Y alignment coil 10*b* is estimated to be optimal is the intersection point K of a straight line AB and an axis indicated by the image displacement vector U, the line AB passing through the coordinate point A in the first image displacement vector A and a coordinate B of the second image displacement vector B in the image displacement vector coordinate system as shown in FIG. 5.

The image displacement vectors K (g, h) and L (s, t) can be computed from the following Eqs. (1)-(4).

$$g = \frac{(b \times c - a \times d) \times m}{(b-d) \times m - (a-c) \times n} \quad (1)$$

$$h = \frac{(b \times c - a \times d) \times n}{(b-d) \times m - (a-c) \times n} \quad (2)$$

$$s = \frac{(b \times e - a \times f) \times q}{(b-f) \times q - (a-e) \times r} \quad (3)$$

$$t = \frac{(b \times e - a \times f) \times r}{(b-f) \times q - (a-e) \times r} \quad (4)$$

In this way, the optimum value calculator 36 calculates the image displacement vectors K and L from the image displacement vectors A, B, C, V, and U.

Then, the optimum value calculator 36 computes the optimum values X3 and Y3 of the excitation currents in the alignment coils 10*a* and 10*b*, respectively, from the image displacement vectors K and L (S13).

FIG. 6 is a diagram illustrating the relationships of the distances of the image displacement vectors A, C, L to the values of the excitation currents in the alignment coils. As shown in this figure, the optimum value X3 of the excitation current in the X alignment coil 10*a* is calculated from the value of the excitation current ORG_X at the first image displacement vector A and from the value of the excitation current ORG_X+AL1 at the third image displacement vector C. The optimum value calculator 36 performs the calculations, for example, using the values of excitation currents ORG_X and ORG_X+AL1 stored in the storage device 32. The optimum value X3 of the excitation current in the X alignment coil 10*a* is found using the following Eqs. (5) and (6). Eq. (5) is applied when the coordinate point A of the first image displacement vector A shown in FIG. 5 lies between the coordinate point C of the third image displacement vector C and a coordinate point L of the image displacement vector L. Eq. (6) is applied when the coordinate point A of the first image displacement vector A does not lie between the coordinate point C of the third image displacement vector C and the coordinate point L of the image displacement vector L.

$$X3 = \frac{(XA - XC) \times \sqrt{(s-a)^2 + (t-b)^2}}{\sqrt{(e-a)^2 + (f-b)^2}} + XA \quad (5)$$

$$X3 = \frac{-(XA - XC) \times \sqrt{(s-a)^2 + (t-b)^2}}{\sqrt{(e-a)^2 + (f-b)^2}} + XA \quad (6)$$

where XA is the value of the excitation current ORG_X at the first image displacement vector A and XC is the value of the excitation current ORG_X+AL1 at the third image displacement vector C.

Figure 7:
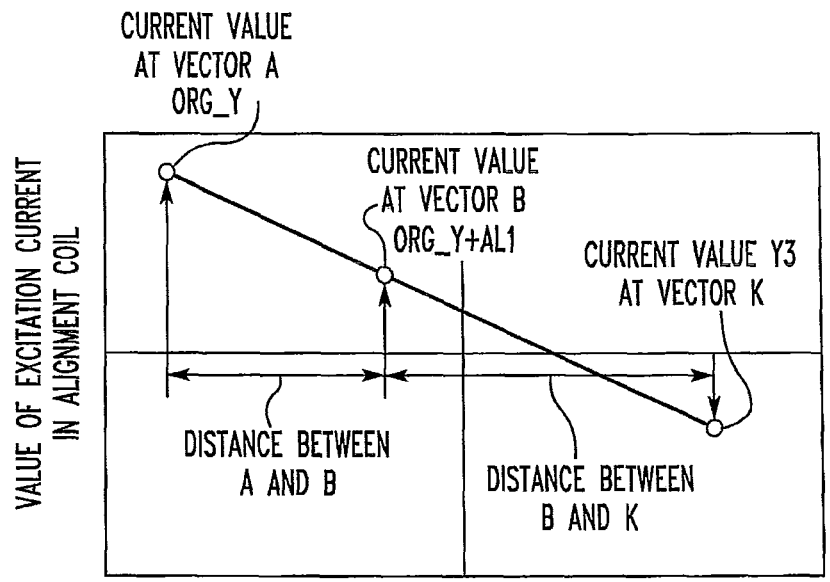
FIG. 7 is a diagram illustrating the relationships among the distances of image displacement vectors A, B, and K and values of excitation currents in alignment coils.

FIG. 7 is a diagram illustrating the relationships of the distances of the image displacement vectors A, B, and K to the values of the excitation current in the alignment coils. As shown in FIG. 7, the optimum value Y3 of the excitation current in the Y alignment coil 10*b* is calculated from the value of the excitation current ORG_Y at the first image displacement vector A and from the value of the excitation current ORG_Y+AL1 at the second image displacement vector B. The optimum value Y3 of the excitation current in the Y alignment coil 10*b* is computed using the following Eqs. (7) and (8). Eq. (7) is applied when the coordinate point A of the first image displacement vector A shown in FIG. 5 lies between the coordinate point B of the second image displacement vector B and the coordinate point K of the image displacement vector K. Eq. (8) is applied when the coordinate point A of the first image displacement vector A does not lie between the coordinate point B of the second image displacement vector B and the coordinate point K of the image displacement vector K.

$$Y3 = \frac{(YA - YB) \times \sqrt{(g-a)^2 + (h-b)^2}}{\sqrt{(c-a)^2 + (d-b)^2}} + YA \quad (7)$$

$$Y3 = \frac{-(YA - YB) \times \sqrt{(g-a)^2 + (h-b)^2}}{\sqrt{(c-a)^2 + (d-b)^2}} + YA \quad (8)$$

where YA is the value of excitation current ORG_Y at the first image displacement vector A and YB is the value of excitation current ORG_Y+AL1 at the second image displacement vector B.

Because of the processing steps described so far, the optimum value X3 of the excitation current in the X alignment coil 10*a* and the maximum value Y3 of the excitation current in the Y alignment coil 10*b* can be computed.

Then, the optimum value calculator 36 creates a control signal based on the calculated optimum values X3 and Y3 of the excitation currents in the alignment coils 10*a* and 10*b* and outputs the control signal to the alignment coil driver amplifier 11 such that the excitation currents in the X and Y alignment coils 10*a* and 10*b* are controlled to assume their optimum values X3 and Y3, respectively.

Because of the processing steps described so far, axial alignment of the charged particle beam B can be made.

According to the axial alignment method associated with the present embodiment for a charged particle beam, the optimum values X3 and Y3 of the excitation currents in the alignment coils 10*a* and 10*b* can be found from the eight images (frames 1-8) as described so far. Since the number of the image data required to be obtained for axial alignment of the beam is small in this way, it is easy to make axial alignment of the beam. Therefore, the burden on the operator of the system is reduced. The time taken to make axial alignment of the beam can be shortened.

According to the method of making axial alignment of a charged particle beam, the method being associated with the present embodiment, if the direction of motion of the image due to a variation of the accelerating voltage is different from the axial directions (X and Y directions) of the alignment coils 10*a* and 10*b*, the optimum values X3 and Y3 of the excitation currents in the alignment coils 10*a* and 10*b* can be computed.

In the method associated with the present embodiment for making axial alignment of a charged particle beam, the incremental amount AL1 by which the value of the excitation current in the alignment coil 10*a* is incremented or decremented can be made different from the incremental or decremental amount AL2 by which the excitation current in the alignment coil 10b is incremented or decremented. Preferably, the incremental amount AL1 has somewhat large value in order to enhance the accuracy at which the image displacement vectors B and C are computed. However, for example, where the incremental amounts AL1 and AL2 are equal (see Third Embodiment described later), the incremental amount AL2 that less affects the computational accuracy is increased. In this case, depending on the shooting conditions (microscope field of view and the final magnification), the amount of displacement of the image exceeds the limit of block matching. As a result, the image displacement vector may not be calculated. Therefore, in a case where the incremental amounts AL1 and AL2 are the same, the shooting conditions under which image data are acquired are restricted. In the present embodiment, the incremental amounts AL1 and AL2 are made different from each other. Thus, the incremental amount AL1 is increased, for example, to such a value that sufficient computational accuracy is obtained. The incremental amount AL2 is reduced to such a value that it falls within the limit of block matching (e.g., smaller than the incremental amount AL1). Hence, the shooting conditions can be modified while enhancing the computational accuracy.

The charged particle beam system 100 associated with the present embodiment has the axial alignment shooting condition setting device 30 for obtaining the first through eighth image data, the image displacement vector calculator 34 for calculating the optimum values X3 and Y3 of the excitation currents in the alignment coils 10a and 10b from the first through eighth image data, and the optimum value calculator 36. Consequently, axial alignment of the charged particle beam B can be automated.

2. Second Embodiment

A method of making axial alignment of a charged particle beam implemented in a charged particle beam system associated with a second embodiment of the present invention is next described. Since the charged particle beam system associated with the second embodiment is similar in configuration with the charged particle beam system 100 already described in connection with FIG. 1, its description is omitted. Similarly, charged particle beam systems associated with third through sixth embodiments (described later) are similar in configuration with the charged particle beam system 100 already described in connection with FIG. 1 and so their description is omitted.

Figure 8:
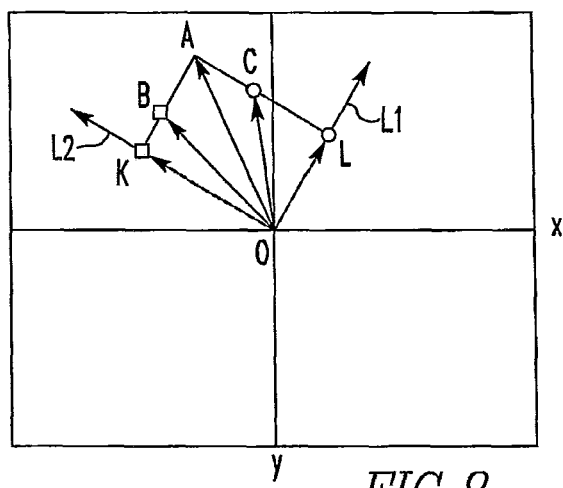
FIG. 8 is a diagram illustrating first through third image displacement vectors associated with a second embodiment of the invention.

FIG. 8 is a diagram illustrating first through third image displacement vectors associated with the present embodiment.

In the first embodiment, the fourth image displacement vector V (q, r) is computed from the frames 1 and 7. The fifth image displacement vector U (m, n) is calculated from the frames 1 and 8. In contrast, in the present embodiment, as shown in FIG. 8, the fourth image displacement vector V (q, r) is replaced by a straight line L1 parallel to the straight line AB. The fifth image displacement vector U (m, n) is replaced by a straight line L2 parallel to the straight line AC. Consequently, the optimum values X3 and Y3 of the excitation currents in the alignment coils 10a and 10b can be computed in the same way as in the first embodiment. In this case, it is not necessary to calculate the fourth image displacement vector V and the fifth image displacement vector U and so acquisition of the images of the frames 7 and 8 is dispensed with. That is, in the second embodiment, three image displacement vectors A, B, and C are calculated from the 6 images (frames 1-6). The optimum values X3 and Y3 of the excitation currents in the alignment coils 10a and 10b can be calculated.

The image displacement vectors K (g, H) and L (s, t) are calculated, using the following Eqs. (9)-(12).

$$g = \frac{(b \times c - a \times d) \times (a - e)}{(b - d) \times (a - e) - (a - c) \times (b - f)} \quad (9)$$

$$h = \frac{(b \times c - a \times d) \times (b - f)}{(b - d) \times (a - e) - (a - c) \times (b - f)} \quad (10)$$

$$s = \frac{(b \times e - a \times f) \times (a - c)}{(b - f) \times (a - c) - (a - e) \times (b - d)} \quad (11)$$

$$t = \frac{(b \times e - a \times f) \times (b - d)}{(b - f) \times (a - c) - (a - e) \times (b - d)} \quad (12)$$

The image displacement vectors K (g, H) and L (s, t) are found from Eqs. (9)-(12). In the same way as in the first embodiment, the optimum values X3 and Y3 of the excitation currents in the alignment coils 10a and 10b are computed, using Eqs. (5)-(8).

According to the second embodiment, the optimum values X3 and Y3 of the excitation currents in the alignment coils 10a and 10b can be found from the 6 images (frames 1-6) as described previously. Since the number of image data required to be obtained for axial alignment of a charged particle beam is small in this way, it is easy to make the axial alignment of the beam. Consequently, the time taken to make the axial alignment of the beam can be shortened. The burden on the operator of the system can be reduced.

3. Third Embodiment

A method of making axial alignment of a charged particle beam in a charged particle beam system is next described, the method being associated with a third embodiment of the present invention.

In the present embodiment, by setting equal the incremental amounts AL1 and AL2 by which the excitation currents in the alignment coils 10a and 10b are incremented or decremented, the frames 3 and 7 are made the same image. Also, the frames 5 and 8 are made the same image. In consequence, the optimum values X3 and Y3 of the excitation currents in the alignment coils 10a and 10b can be calculated from 6 images (frames 1 to 6).

More specifically, the image displacement vector calculator 34 calculates the fourth image displacement vector V from the amount of positional deviation between the frames 1 and 3 and the fifth image displacement vector U from the amount of positional deviation between the frames 1 and 5. Subsequent computations are the same as in the first embodiment and so their description is omitted.

According to the present embodiment, it is possible to find the optimum values X3 and Y3 of the excitation currents in the alignment coils 10a and 10b from the 6 images (frames 1 to 6) as described previously. Since the number of image data required to be obtained for axial alignment of the charged particle beam is small in this way, the axial alignment of the beam can be done easily. Accordingly, the time taken to make the axial alignment of the beam can be shortened. Also, the burden on the operator of the system can be alleviated.

4. Fourth Embodiment

A method of making axial alignment of a charged particle beam in a charged particle beam system is next described, the method being associated with a fourth embodiment of the invention.

In the first embodiment, after the shooting condition setting device 30 for axial alignment obtains all of the first through eighth image data, the image displacement vector calculator 34 calculates the first through fifth image displacement vectors A, B, C, U, and V. In contrast, in the present embodiment, when the setting device 30 successfully obtains a combination of images necessary for calculation of image displacement vectors, the vector calculator 34 calculates the image displacement vector of that combination. Consequently, the computational processing can be performed efficiently.

Specifically, for example, when the first and second image data are acquired successfully by the shooting condition setting device 30 for axial alignment, the image displacement vector calculator 34 calculates the first image displacement vector A. Then, when the third and fourth image data are obtained by the setting device 30, the vector calculator 34 computes the second image displacement vector B. Then, when the fifth and sixth image data are acquired by the setting device 30, the vector calculator 34 calculates the third image displacement vector C.

5. Fifth Embodiment

A method of making axial alignment of a charged particle beam in a charged particle beam system is next described, the method being associated with a fifth embodiment of the invention.

In the first embodiment, as shown in FIG. 5, the image displacement vector K is calculated from the two image displacement vectors A and B. The image displacement vector L is calculated from the two image displacement vectors A and C. In contrast, in the present embodiment, each of the image displacement vectors K and L can be calculated from three or more image displacement vectors. Consequently, the vectors K and L can be computed more accurately. Hence, the optimum values X3 and Y3 of the excitation currents in the alignment coils 10a and 10b can be found more accurately.

In the present embodiment, the optimum value calculator 36 determines a straight line, for example, corresponding to the straight lines AC and AB of the first embodiment from three or more image displacement vectors by least squares approximation or other method. Furthermore, each of the straight lines AC and AB of the first embodiment may be replaced by a quadratic (second order) curve or higher order curve calculated from three or more image displacement vectors.

6. Sixth Embodiment

A method of making axial alignment of a charged particle beam in a charged particle beam system associated with a sixth embodiment of the invention is next described.

In the charged particle beam system 100 associated with the first embodiment, the shooting condition setting device 30 for axial alignment increments or decrements the initial value HV of the accelerating voltage by only the incremental amounts V1 and V2 to thereby vary the focal position of the charged particle beam B, takes the frames 1-8, and obtains the first through eighth image data. In contrast, in the present embodiment, the shooting condition setting device 30 increments or decrements the excitation current in the objective lens 14 to thereby change the focal position of the beam B, takes the frames 1-8, and acquires the first through eighth images. In this case, the setting device 30 may be connected with the objective lens driver amplifier 15 in a manner not illustrated, and control the focal position of the beam B by controlling the excitation current in the objective lens 14 via the driver amplifier 15.

7. Seventh Embodiment

Figure 9:
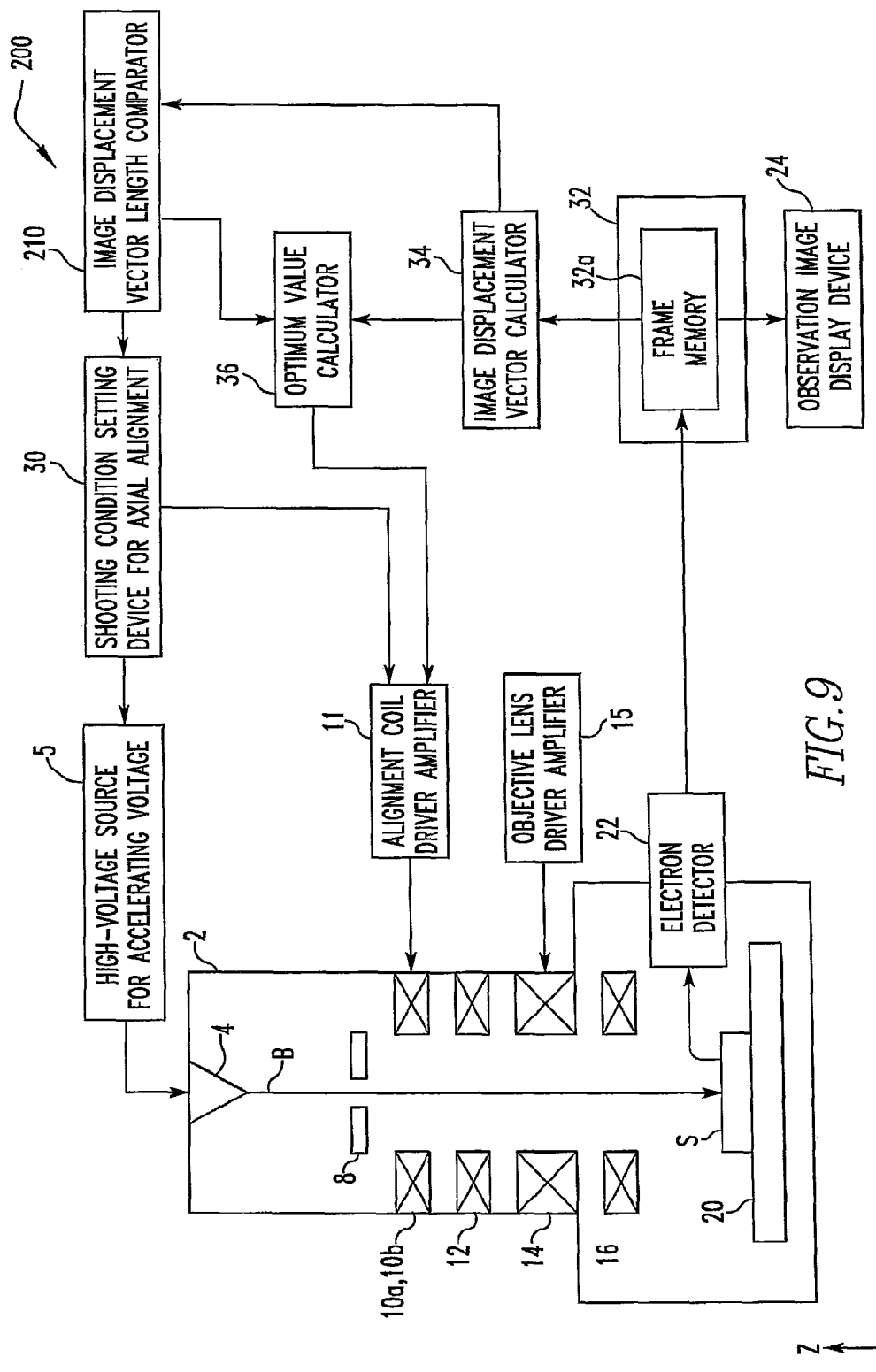
FIG. 9 is a block diagram illustrating the configuration of a charged particle beam system associated with a seventh embodiment of the invention.

A charged particle beam system associated with a seventh embodiment of the invention is next described. FIG. 9 illustrates the configuration of this charged particle beam system associated with the seventh embodiment, the system being generally indicated by reference numeral 200. Those components of the system 200 which are functionally similar to their counterparts of the charged particle beam system 100 associated with the first embodiment are indicated by the same reference numerals as in the description of the first embodiment and their detailed description is omitted.

As shown in FIG. 9, the charged particle beam system 200 includes an image displacement vector length comparator 210 in addition to the components of the charged particle beam system 100.

The image displacement vector length comparator 210 makes a decision as to whether an image displacement vector, which has been calculated from two image data with different accelerating voltages (focal positions), is greater than a given value. A case in which the first image displacement vector A is used as an image displacement vector, which has been computed from two image data with different accelerating voltages (focal positions), is described below.

The image displacement vector length comparator 126 makes a decision as to whether the magnitude of the first image displacement vector A is greater than a threshold value or other given value. Information about the vector A is entered into the comparator 210 from the image displacement vector calculator 34. The magnitude |A| of the image displacement vector A can be calculated using the following formula:

$$|A| = \sqrt{a^2 + b^2}$$

where a and b are the elements of the image displacement vector A.

The threshold value is so set that if the magnitude |A| of the image displacement vector A is greater than the threshold value, the axis of the charged particle beam B can be said to be misaligned. That is, where the axis of the beam B is aligned more precisely, the threshold value is set to a smaller value. The threshold value may be set at will, for example, by the operator of the system.

If the image displacement vector length comparator 210 determines that the magnitude |A| of the first image displacement vector A is greater than the threshold value, i.e., the axis of the beam B is misaligned, the comparator outputs decision information to the optimum value calculator 36.

Based on the decision information, the optimum value calculator 36 calculates the values of the excitation currents in the first and second alignment coils, respectively, for axial alignment of the charged particle beam B.

If it is determined that the magnitude |A| of the image displacement vector A is less than the threshold value, the image displacement vector length comparator 210 outputs decision information to the shooting condition setting device 30 for axial alignment.

Based on the decision information, the shooting condition setting device 30 delivers information about the values of the excitation currents (initial values) in the alignment coils 10a and 10b assumed prior to axial alignment (when first and second image data for calculating the image displacement vector A were obtained) to the alignment coil driver amplifier 11 to control the excitation currents in the coils 10a and 10b to assume current values taken prior to the axial alignment.

The operation of the charged particle beam system 200 is next described.

Figure 10:
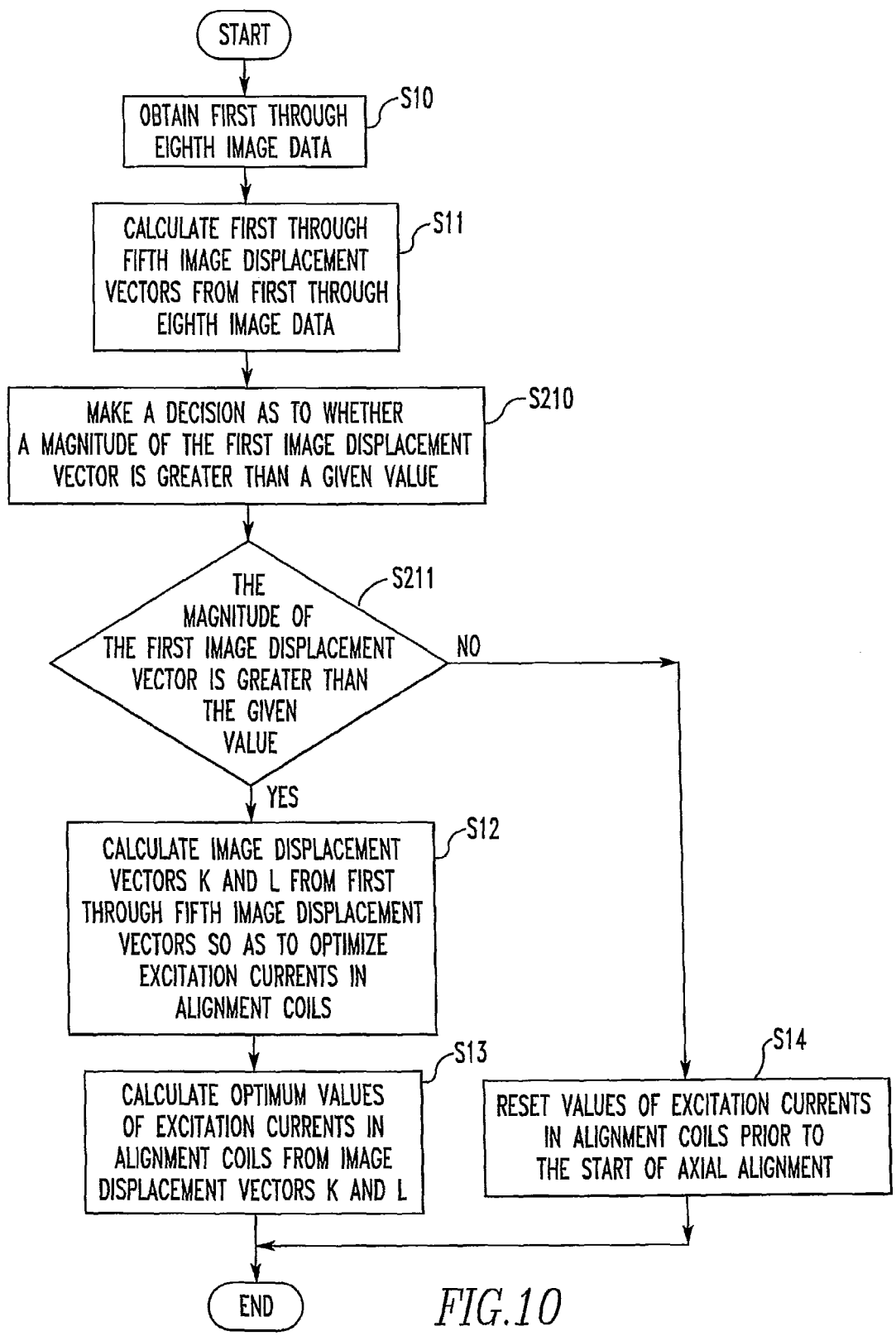
FIG. 10 is a flowchart illustrating a sequence of steps for making axial alignment of a charged particle beam, the steps being associated with the seventh embodiment.

FIG. 10 is a flowchart illustrating one example of sequence of steps for axial alignment performed by the charged particle beam system 200. This sequence of steps for axial alignment is similar to the sequence of steps for axial alignment performed by the charged particle beam system 100 except that steps (S210 and S211) for making a decision as to whether the magnitude of the first image displacement vector A is greater than a given value are added. These added steps S210 and S211 are described below.

First, the image displacement vector calculator 34 outputs information about the calculated image displacement vector A to the image displacement vector length comparator 210. Based on the information about the vector A, the comparator 210 calculates the magnitude |A| of the image displacement vector A.

Then, the image displacement vector length comparator 210 compares the magnitude |A| of the image displacement vector A against a given threshold value.

If the decision of step S211 is YES, i.e., the vector length comparator 210 has determined that the magnitude |A| of the image displacement vector A is greater than the threshold value, the excitation currents in the alignment coils 10a and 10b prior to automated axial alignment are regarded as not optimal. The optimum value calculator 36 calculates the optimum values of the excitation currents in the alignment coils 10a and 10b from the first through fifth image displacement vectors A, B, C, V, and U, sets the optimum values, and carries out an operation for axial alignment (S12 and S13).

If the image displacement vector length comparator 210 determines that the magnitude |A| of the image displacement vector A is less than the threshold value (NO at S211), the excitation currents in the alignment coils 10a and 10b prior to the start of the automated axial alignment are regarded as already optimal. The shooting condition setting device 30 for axial alignment resets the values of the excitation currents in the alignment coils 10a and 10b prior to the start of the axial alignment (when image data for calculation of the image displacement vector A is obtained) to their initial values (S14), and terminates the processing routine.

This decision is equivalent to the case in which, when the axis of the charged particle beam B is misaligned, the image obtained after incrementing or decrementing the accelerating voltage (wobbler operation) seems unsteady, while, when the axis of the beam B is already aligned, the wobbler image seems still.

According to the present embodiment, if the decision is that the axis of the charged particle beam B is aligned, the values of the excitation currents in the alignment coils 10a and 10b are not modified and, therefore, for example, after the axial alignment operation of the charged particle beam system, the axis of the beam B can be prevented from being more misaligned than prior to the axial alignment operation. Consequently, the reliability of the system can be enhanced.

8. Eighth Embodiment

Figure 11:
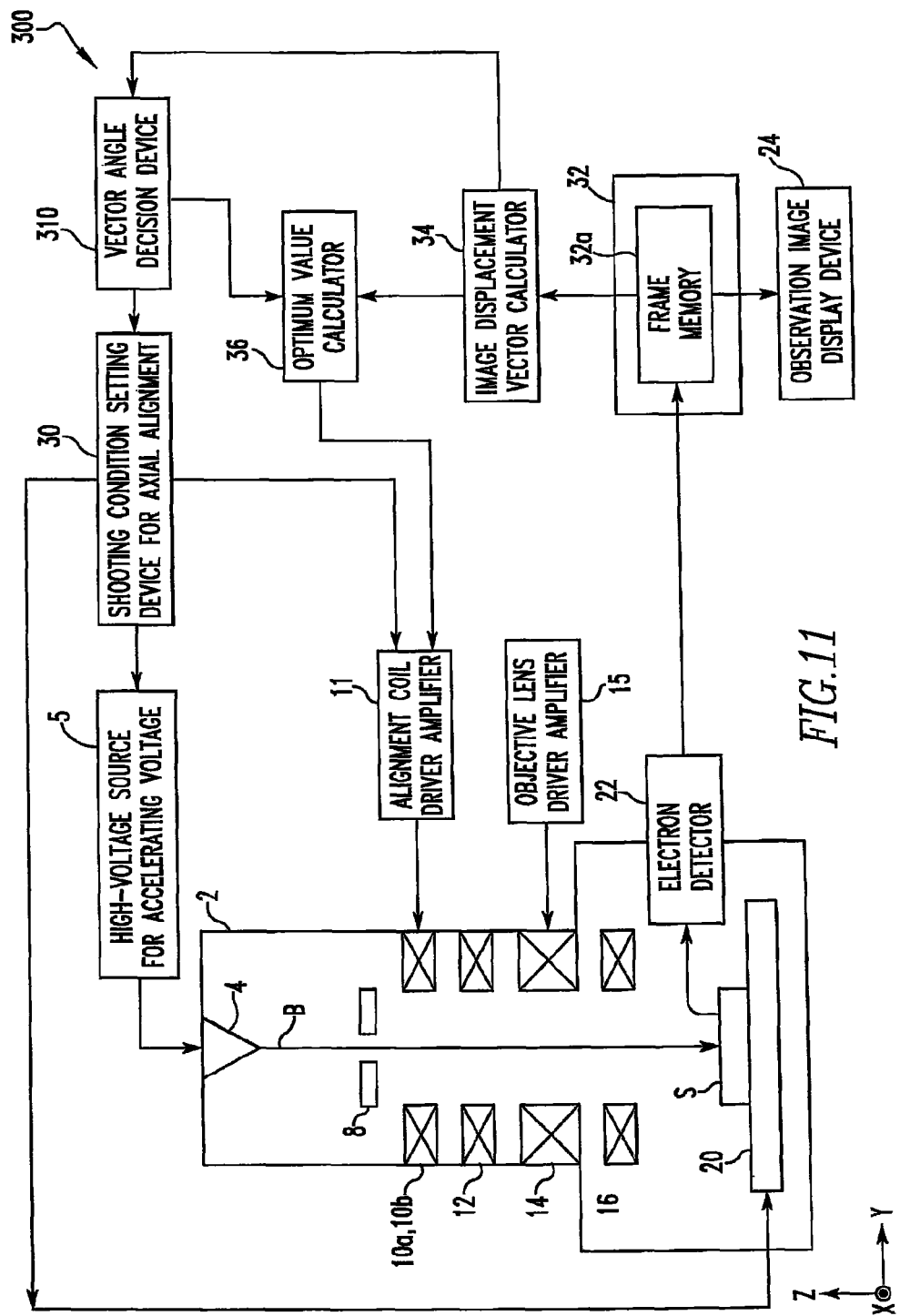
FIG. 11 is a block diagram illustrating the configuration of a charged particle beam system associated with an eighth embodiment of the invention.

A charged particle beam system associated with an eighth embodiment of the invention is next described. FIG. 11 shows the configuration of the charged particle beam system associated with an eighth embodiment of the invention, the system being generally indicated by reference numeral 300. Those components of the system 300 which are functionally similar to their counterparts of the charged particle beam system 100 associated with the first embodiment are indicated by the same reference numerals as in the description of the first embodiment and their detailed description will be omitted below.

As shown in FIG. 11, the charged particle beam system 300 includes a vector angle decision device 310 in addition to the components of the charged particle beam system 100.

Figure 12:
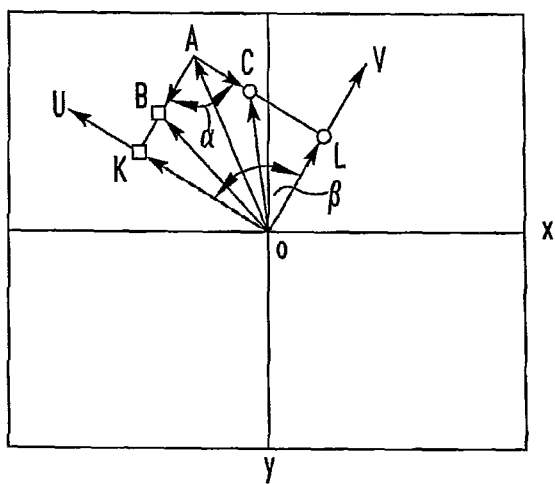
FIG. 12 is a diagram illustrating the relationship among first through fifth image displacement vectors.

FIG. 12 is a diagram illustrating the relationships among the first through fifth image displacement vectors A, B, C, D, V, and U.

The vector angle decision device 310 makes a decision as to whether the angle α made between the vector AB that is the difference between the second image displacement vector B and the first image displacement vector A and the vector AC that is the difference between the third image displacement vector C and the first image displacement vector A falls within a given angular range. Consequently, a decision is made as to whether the first through third image displacement vectors A, B, C are used for the calculation of the optimum values of the excitation currents in the alignment coils 10a and 10b. Information about the first through third image displacement vectors A, B, and C is entered into the vector angle decision device 310 from the image displacement vector calculator 34.

For example, the angle α can be found from the following equation.

$$\alpha = \cos^{-1}\left(\frac{AB \cdot AC}{|AB| \times |AC|}\right)$$

where AB·AC is the inner product of the vectors AB and AC.

In the charged particle beam system 300, the direction in which the charged particle beam B is deflected by the X alignment coil 10a is, for example, orthogonal to the direction in which the beam B is deflected by the Y alignment coil 10b. In this case, the vectors AB and AC are ideally orthogonal to each other (the angle α=90°). Therefore, if the angle α is near 90°, it can be said that the first through third image displacement vectors A, B, and C have been computed correctly. Accordingly, a decision is made from the angle α as to whether the first through third image displacement vectors A, B, and C have been computed correctly.

The given angular range is set, for example, to a range including an ideal value of the angle α (90° in this example) plus a tolerable error. Accordingly, where the axis of the beam B is aligned more precisely, the given angular range is set to a narrower range. The given angular range may be set at will, for example, by the operator of the system.

In this case, the direction of deflection made by the X alignment coil 10a is orthogonal to the direction of deflection made by the Y alignment coil 10b. Where the angle made between these two directions of deflection is other than 90°, this angle is an ideal value of the angle α. Therefore, in this case, the given angular range is set according to the angle.

If the vector angle decision device 310 determines that the angle α is not contained in the given angular range, the device outputs decision information to the shooting condition setting device 30 for axial alignment.

The shooting condition setting device 30 for axial alignment varies at least one of the magnification and field of view based on the decision information and again obtains the first through eighth image data. Where the magnification of the obtained image data is varied, the setting device 30 controls, for example, the objective lens driver amplifier 15 to modify the magnification. Where the field of view of the obtained image data is varied, the setting device 30 controls, for example, the sample stage 20 to thereby vary the field of view.

If the vector angle decision device 310 determines that the angle α is contained in the given angular range, the decision device outputs decision information to the optimum value calculator 36.

Receiving the decision information, the optimum value calculator 36 calculates the values of the excitation currents in the X alignment coil 10a and Y alignment coil 10b for axial alignment of the charged particle beam B from the first through fifth image displacement vectors A, B, C, V, and U.

The operation of the charged particle beam system 300 associated with the present embodiment is next described.

Figure 13:
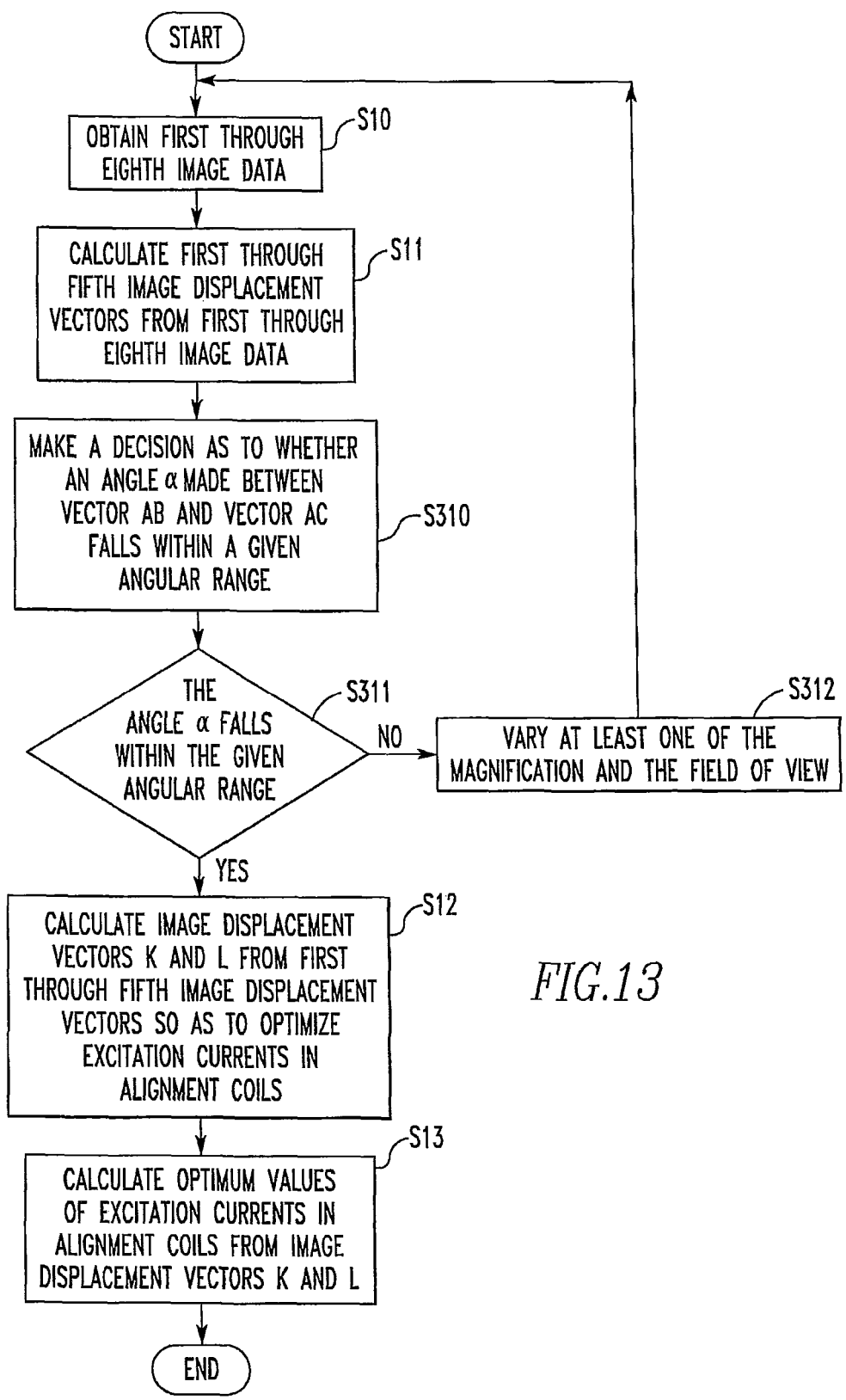
FIG. 13 is a flowchart illustrating a sequence of steps for making axial alignment of a charged particle beam, the steps being associated with the eighth embodiment.

FIG. 13 is a flowchart illustrating one example of sequence of steps for axial alignment performed by the charged particle beam system 300. This sequence of steps for axial alignment is similar to the sequence of steps for axial alignment performed by the charged particle beam system 100 except that steps (S310 and S311) of making a decision as to whether the angle α is contained in the given angular range and a step (S312) of making a decision as to whether at least one of the magnification of the obtained image and the field of view is varied are added. Accordingly, the added steps S310-S312 are described below.

In the steps (S310 and S311) of making a decision as to whether the angle α is contained in the given angular range, the image displacement vector calculator 34 outputs information about the calculated image displacement vectors A, B, and C to the vector angle decision device 310. Based on the information about the image displacement vectors A, B, and C, the decision device 310 computes the angle α made between the vector AB that is the difference between the second image displacement vector B and the first image displacement vector A and the vector AC that is the difference between the third image displacement vector C and the first image displacement vector A.

Then, the vector angle decision device 310 makes a decision as to whether the computed angle α is contained in the given angular range.

If the vector angle decision device 310 determines that the angle α is contained in the given angular range (YES at S311), then the image displacement vectors A, B, and C are regarded to have been correctly calculated. The optimum value calculator 36 calculates the optimum values of the excitation currents in the alignment coils 10a and 10b from the first through fifth image displacement vectors A, B, C, V, and U, sets the values, and carries out an operation for axial alignment (S12 and S13).

If the vector angle decision device 310 determines that the angle α is not contained in the given angular range (NO at S311), then the image displacement vectors A, B, and C are not regarded as having been correctly computed. The axial alignment shooting condition setting device 30 controls the objective lens driver amplifier 15 or the sample stage 20 to thereby vary at least one of the magnification and field of view to again perform the step of obtaining the first through eighth image data (S312). The charged particle beam system 300 again finds the first through fifth image displacement vectors A, B, C, V, and U, using the first through eighth image data obtained by varying at least one of the magnification and field of view, and performs the processing steps for calculating the optimum values of the excitation currents in the alignment coils 10a and 10b (S11, S310, S311, S12, and S13).

In the present embodiment, the vector angle decision device 310 makes a decision as to whether the angle α is contained in the given angular range. Thus, it is possible to make a decision as to whether the calculated first through third image displacement vectors A, B, and C are used for calculation of the optimum values of the excitation currents in the alignment coils 10a and 10b. Therefore, where the first through third image displacement vectors A, B, and C have not been correctly calculated, it is possible that the first through third image displacement vectors A, B, and C will not be used for the calculation of the optimum values of the excitation currents in the alignment coils 10a and 10b. Accordingly, after an axial alignment operation of the charged particle beam system, it can be prevented that the axis of the beam B is more misaligned than prior to the axial alignment operation. Hence, the reliability of the system can be enhanced.

According to the present embodiment, in a case where the angle α is not contained in the given angular range, i.e., the first through third image displacement vectors A, B, and C are not used for the calculation, at least one of the magnification and field of view can be varied, and the first through eighth image data are again obtained. One example of the main cause of incorrect calculation of image displacement vectors is that the pattern of the image (image data) used in calculating the image displacement vectors is not appropriate (e.g., foreign matter forming indicia is not contained). In this case, block matching relying on computation of cross-correlation is not performed well, and image displacement vectors cannot be calculated correctly. That is, in the case of an image (image data) having an inappropriate pattern, there is a high possibility that the image displacement vectors will not be calculated correctly whatever times is the calculation repeated. In the present embodiment, in a case where the image displacement vectors A, B, and C are not correctly computed, at least one of the field of view and magnification is varied, i.e., the pattern is varied, and the first through eighth image data can be again obtained. Consequently, the above-described problem does not occur.

9. Ninth Embodiment

Figure 14:
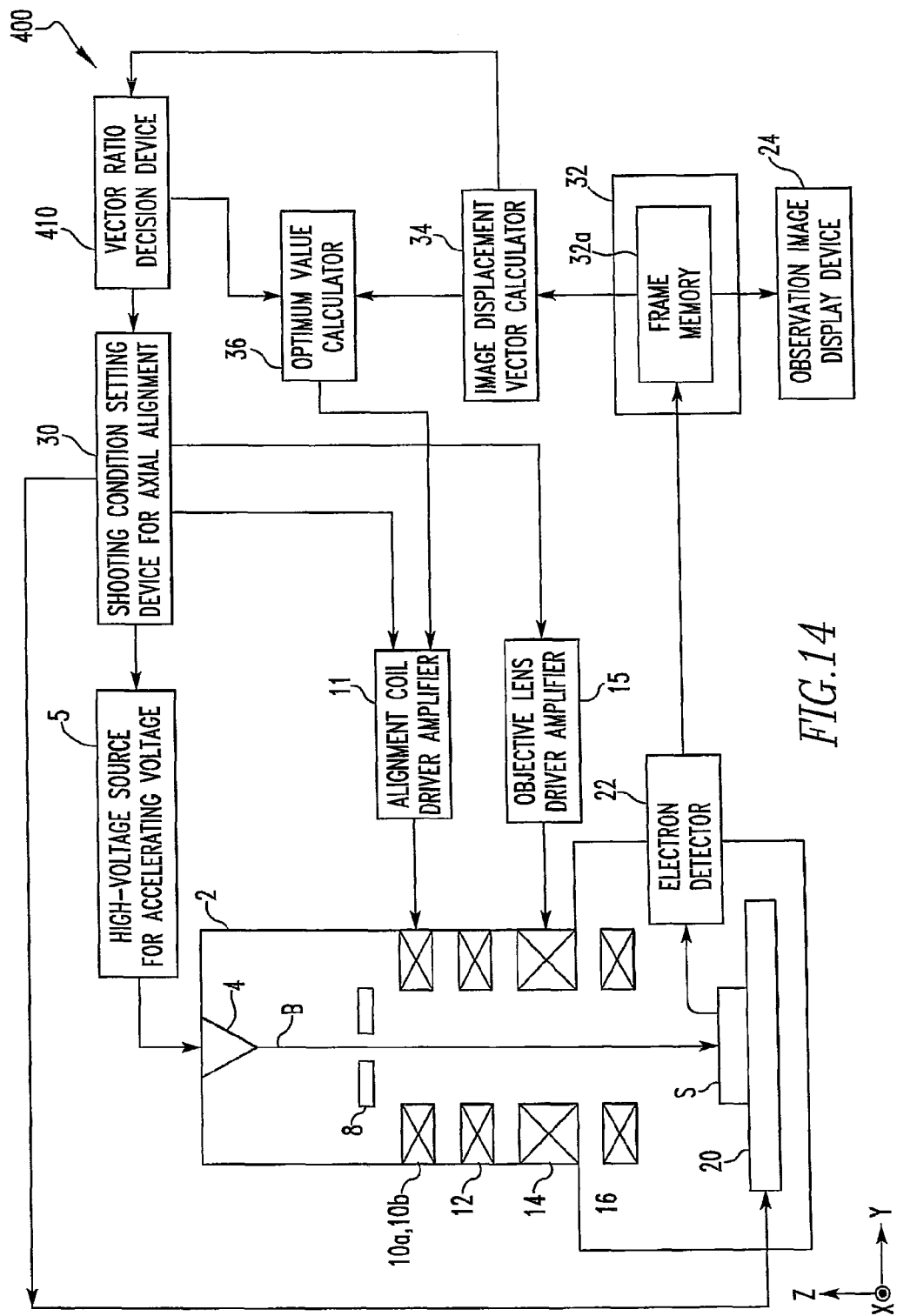
FIG. 14 is a block diagram illustrating the configuration of a charged particle beam system associated with a ninth embodiment of the invention.

A charged particle beam system associated with a ninth embodiment of the invention is next described. FIG. 14 is a diagram showing the configuration of the charged particle beam system associated with the ninth embodiment. The charged particle beam system, generally indicated by reference numeral 400, is similar to the charged particle beam system 100 associated with the first embodiment and to the charged particle beam system 300 associated with the eighth embodiment. Those components of the system 400 which are functionally similar to their counterparts of the systems 100 and 300 are indicated by the same reference numerals as in the foregoing description and their detailed description is omitted.

As shown in FIG. 14, the charged particle beam system 400 includes a vector ratio decision device 410 in addition to the components of the charged particle beam system 100.

The vector ratio decision device 410 makes a decision as to whether the ratio R1 of the magnitude |AC| of the vector AC that is the difference between the third image displacement vector C and the first image displacement vector A to the magnitude |AB| of the vector AB that is the difference between the second image displacement vector B and the first image displacement vector A as shown in FIG. 12 falls within a given range. Consequently, a decision is made as to whether the first through third image displacement vectors A, B, and C are used for calculation of the optimum values of the excitation currents in the alignment coils 10a and 10b. Information about the first through third image displacement vectors A, B, and C is entered into the vector ratio decision device 410 from the image displacement vector calculator 34.

The ratio R1 can be found, for example, from the following equation.

$$R1 = \frac{|AB|}{|AC|}$$

The charged particle beam system 400 finds the second image displacement vector B from the amount of positional deviation between the frame 3 (third image data) and the frame 4 (fourth image data) (see FIG. 4B), for example, in the same way as the charged particle beam 100. At this time, the value of the excitation current in the Y alignment coil 10b has been incremented or decremented by the incremental amount AL1. Furthermore, the system 400 finds the third image displacement vector C from the amount of positional deviation between the frame 5 (fifth image data) and the frame 6 (sixth image data) (see FIG. 4C), for example, in the same way as the charged particle beam system 100. At this time, the value of the excitation current in the X alignment coil 10a has been incremented or decremented by the incremental amount AL1. In this case, the magnitude |AB| of the vector AB and the magnitude |AC| of the vector AC are ideally the same (R1=1). Therefore, if the ratio R1 has a value in the vicinity of 1, it can be said that the first through third image displacement vectors A, B, and C have been correctly calculated. Therefore, it is possible to make a decision from the ratio R1 as to whether the first through third image displacement vectors A, B, and C have been correctly computed.

The given range is set, for example, to include an ideal value of the ratio R1 (1 in this example) plus a tolerable error. Therefore, where the axis of the charged particle beam B is aligned more precisely, the given range is set to a narrower range. The given range may be set at will, for example, by the operator of the system.

In the present case described so far, the incremental amount used when the second image displacement vector B is found and the incremental amount used when the third image displacement vector C is found are both equal to AL1. Where they are different, the ideal value of the ratio R1 is equal to the ratio between these two incremental amounts. In this case, accordingly, the given range is set according to the ratio between the incremental amounts.

If the vector ratio decision device 410 determines that the ratio R1 is not contained in the given range, the device outputs decision information to the shooting condition setting device 30 for axial alignment. Based on the decision information, the setting device 30 varies at least one of the magnification and field of view and again obtains the first through eighth image data.

If the vector ratio decision device 410 determines that the ratio R1 is contained in the given range, the decision device outputs decision information to the optimum value calculator 36. Based on the decision information, the optimum value calculator 36 calculates optimum values of the excitation currents in the alignment coils 10a and 10b from the first through fifth image displacement vectors A, B, C, V, and U.

The operation of the charged particle beam system 400 associated with the present embodiment is next described.

Figure 15:
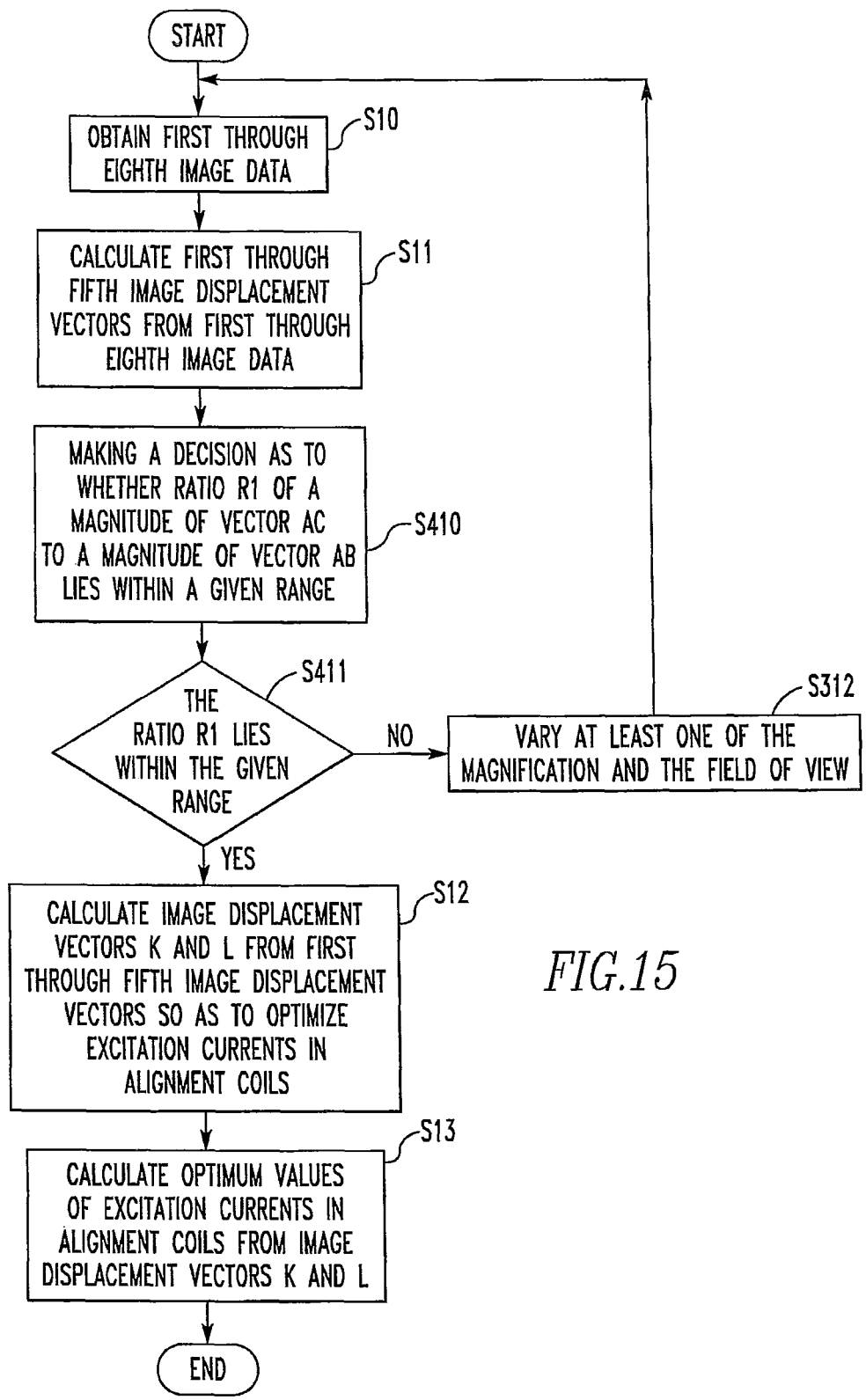
FIG. 15 is a flowchart illustrating a sequence of steps for making axial alignment of a charged particle beam, the steps being associated with the ninth embodiment.

FIG. 15 is a flowchart illustrating one example of sequence of steps for axial alignment performed by the charged particle beam system 400. This sequence of steps is similar to the sequence of steps for axial alignment performed by the charged particle beam system 100 except that steps S410 and S411 for making a decision as to whether the ratio R1 lies within a given range and a step S312 for varying at least one of the magnification of the obtained image and field of view are added. These added steps S410, S411, and S312 are described below.

In the steps S410 and S411 for making a decision as to whether the ratio R1 lies within the given range, the image displacement vector calculator 34 first outputs information about the calculated image displacement vectors A, B, and C to the vector ratio decision device 410. Based on the information about the calculated image displacement vectors A, B, and C, the vector ratio decision device 410 calculates the ratio R1 between the magnitude |AB| that is the magnitude of the difference between the second image displacement vector B and the first image displacement vector A and the magnitude |AC| of the difference between the third image displacement vector C and the first image displacement vector A.

Then, the vector ratio decision device 410 makes a decision as to whether the calculated ratio R1 falls within the given range.

If the vector ratio decision device 410 determines that the ratio R1 lies within the given range (YES at S411), then the image displacement vectors A, B, and C are regarded as having been correctly computed. Then, the optimum value calculator 36 calculates optimum values of the excitation currents in the alignment coils 10a and 10b from the first through fifth image displacement vectors A, B, C, V, and U, sets the excitation currents, and carries out an axial alignment operation (S12 and S13).

If the vector ratio decision device 410 determines that the ratio R1 does not lie within the given range (NO at S411), then the image displacement vectors A, B, and C are regarded as not having been correctly computed. The shooting condition setting device 30 for axial alignment controls the objective lens driver amplifier 15 and/or the sample stage 20 to vary at least one of the magnification and field of view and performs the step S312 again to obtain the first through eighth image data. Using these first through eighth image data, the beam system 400 again finds the first through fifth image data vectors A, B, C, V, and U and calculates optimum values of the excitation currents in the alignment coils 10a and 10b (S11, S410, S411, S12, and S13).

In the present embodiment, the vector ratio decision device 410 makes a decision as to whether the ratio R1 lies within the given range. This makes it possible to make a decision as to whether the calculated first through third image displacement vectors A, B, and C are used for calculation of the optimum values of the excitation currents in the alignment coils 10a and 10b. Therefore, where the first through third image displacement vectors A, B, and C have not been correctly computed, it is possible that the first through third image displacement vectors A, B, and C will not used for computation of the optimum values of the excitation currents in the alignment coils 10a and 10b. Accordingly, for example, after an operation for making axial alignment of the charged particle beam system, the axis of the beam B can be prevented from being more misaligned than prior to the operation of the axial alignment. Hence, the reliability of the system can be enhanced.

According to the present embodiment, in a case where the ratio R1 does not fall within the given angular range, at least one of the magnification and field of view is varied, and the first through eighth image data can be again acquired. Accordingly, it is possible to yield the same advantageous effects as produced by the eighth embodiment.

10. Tenth Embodiment

A charged particle beam system associated with a tenth embodiment of the invention is next described. This charged particle beam system is similar in configuration to the charged particle beam system 300 already described in connection with FIG. 11.

The charged particle beam system, generally indicated by reference numeral 300, associated with the present embodiment is similar to the charged particle beam system 100 except that the vector angle decision device 310 is added as shown in FIG. 11.

The vector angle decision device 310 makes a decision as to whether the angle β made between the fourth image displacement vector V and the fifth image displacement vector U shown in FIG. 12 falls within a given angular range. Consequently, a decision is made as to whether the fourth and fifth image displacement vectors V, U are used for calculation of optimum values of the excitation currents in the alignment coils 10a and 10b. Information about the fourth and fifth image displacement vectors V and U are entered into the vector angle decision device 310 from the image displacement vector calculator 34.

The angle β can be found, for example, from the following equation.

$$\beta = \cos^{-1}\left(\frac{U \cdot V}{|U| \times |V|}\right)$$

where U·V is the inner product of the vectors U and V.

In the charged particle beam system 300, the direction in which the charged particle beam B is deflected by the X alignment coil 10a is orthogonal to the direction in which the beam B is deflected by the Y alignment coil 10b. In this case, the fourth image displacement vector V and the fifth image displacement vector U are ideally orthogonal to each other (angle β=90°). Therefore, where the angle β has a value in the vicinity of 90°, it can be said that the fourth and fifth image displacement vectors V and U have been correctly computed. Accordingly, it is possible to make a decision from the angle β as to whether the fourth and fifth image displacement vectors V and U have been correctly computed.

The given angular range is set, for example, to have an ideal value of the angle β (90° in this example) plus a tolerable error. Therefore, where the axis of the beam B is aligned more precisely, the given angular range is set to a narrower range. The given angular range may be set at will, for example, by the operator of the system.

In the case described above, the direction of deflection made by the X alignment coil 10a is orthogonal to the direction of deflection made by the Y alignment coil 10b. Where the angle made between these two directions of deflection is an angle other than 90°, this angle is an ideal value of the angle β. In this case, therefore, the given angular range is set according to the angle.

If the vector angle decision device 310 determines that the angle β does not lie within the given angular range, the decision device outputs decision information to the shooting condition setting device 30 for axial alignment.

Based on the decision information, the shooting condition setting device 30 for axial alignment varies at least one of the magnification and field of view and again obtains the first through eighth image data.

If the vector angle decision device 310 determines that the angle β is contained in the given angular range, the decision device outputs decision information to the optimum value calculator 36.

Based on the decision information, the optimum value calculator 36 calculates the values of the excitation currents in the X and Y alignment coils 10a and 10b for axial alignment of the beam B from the first through fifth image displacement vectors A, B, C, V, and U.

The charged particle beam system associated with the present embodiment is similar in operation to the system associated with the eighth embodiment except for the angle providing a reference in making a decision. That is, in the eighth embodiment, the angle α provides a reference. In the present embodiment, the angle β provides a reference.

In the present embodiment, the vector angle decision device 310 makes a decision as to whether the angle β is contained within the given angular range. This makes it possible to make a decision as to whether the computed fourth and fifth image displacement vectors V and U are used for calculation of optimum values of the excitation currents in the alignment coils 10a and 10b. Therefore, where the fourth and fifth image displacement vectors V and U have not been correctly calculated, it is possible that the fourth and fifth image displacement vectors V, U will not be used for calculation of the optimum values of the excitation currents in the alignment coils 10a and 10b. Accordingly, for example, after the operation of axial alignment of the charged particle beam system, the axis of the beam B can be prevented from being more misaligned than prior to the operation of axial alignment of the system. Consequently, the reliability of the system can be enhanced.

According to the present embodiment, in a case where the angle β is not contained within the given angular range, at least one of the magnification and field of view can be varied, and the first through eighth image data can be again obtained. Accordingly, the present embodiment can yield the same advantageous effects as produced by the eighth embodiment.

11. Eleventh Embodiment

A charged particle beam system associated with an eleventh embodiment of the invention is next described. This system is similar in configuration to the charged particle beam system 400 already described in connection with FIG. 14.

The charged particle beam system, generally indicated by reference numeral 400, associated with the present embodiment is similar to the charged particle beam system 100 except that a vector ratio decision device 410 is added as shown in FIG. 14.

The vector ratio decision device 410 makes a decision as to whether the ratio R2 between the magnitude |V| of the fourth image displacement vector V and the magnitude |U| of the fifth image displacement vector U as shown in FIG. 12 is contained within a given range. This makes it possible to make a decision as to whether the fourth and fifth image displacement vectors V, U are used for calculation of optimum values of the excitation currents in the alignment coils 10a and 10b. Information about the fourth and fifth image displacement vectors V, U is entered into the vector ratio decision device 410 from the image displacement vector calculator 34.

The ratio R2 can be found, for example, from the following equation.

$$R2 = \frac{|U|}{|V|}$$

The charged particle beam system 400 finds the fourth image displacement vector V from the amount of positional deviation between the frame 1 (first image data) and the frame 7 (seventh image data) (see FIG. 4D), for example, in the same way as the charged particle beam system 100. At this time, the value of the excitation current in the Y alignment coil 10b has been varied by the incremental amount AL2. Furthermore, the beam system 400 finds the fifth image displacement vector U from the amount of positional deviation between the frame 1 (first image data) and the frame 8 (eighth image data) (see FIG. 4E) in the same way as the charged particle beam system 100. At this time, the value of the excitation current in the X alignment coil 10a has been varied by the incremental amount AL2. In this case, the magnitude |V| of the fourth image displacement vector V and the magnitude |U| of the fifth image displacement vector U are ideally equal to each other (R2=1). Therefore, if the ratio R2 has a value in the vicinity of 1, it can be said that the fourth and fifth image displacement vectors V and U have been correctly computed. Therefore, a decision can be made from the ratio R2 as to whether the fourth and fifth image displacement vectors V and U have been correctly computed.

The given range is set, for example, to a range including an ideal value of the ratio R2 (1 in this example) plus a tolerable range. Accordingly, where the axis of the charged particle beam B is aligned more precisely, the given range is set to a narrower range. The given range may be set at will, for example, by the operator of the system.

In the present case described so far, the incremental amount used when the fourth image displacement vector V is found and the incremental amount used when the fifth image displacement vector U is found are both equal to AL2. Where the incremental amounts are different, the ideal value of the ratio R2 is equal to the ratio between the incremental amounts. In this case, therefore, the given range is set according to the ratio between the incremental amounts.

If the vector ratio decision device 410 has determined that the ratio R2 is not contained in the given range, the decision device outputs decision information to the shooting condition setting device 30 for axial alignment. Based on the decision information, the setting device 30 varies at least one of the magnification and field of view and again obtains the first through eighth image data.

If the vector ratio decision device 410 determines that the ratio R2 is contained in the given range, the decision device outputs decision information to the optimum value calculator 36. Based on the decision information, the optimum value calculator 36 calculates values of the excitation currents in the X alignment coil 10a and Y alignment coil 10b for axial alignment of the beam B from the first through fifth image displacement vectors A, B, C, V, and U.

The charged particle beam system associated with the present embodiment is similar in operation to the system associated with the ninth embodiment except that the ratio R1 provides a reference in making a decision in the ninth embodiment, whereas in the present embodiment, the ratio R2 provides a reference in making a decision.

In the present embodiment, the vector ratio decision device 410 makes a decision as to whether the ratio R2 is contained in the given range. This makes it possible to make a decision as to whether the computed fourth and fifth image displacement vectors V and U are used for calculation of optimum values of the excitation currents in the alignment coils 10a and 10b. Therefore, where the fourth and fifth image displacement vectors V and U have not been correctly computed, it is possible that the fourth and fifth image displacement vectors V and U are not used for calculation of optimum values of the excitation currents in the alignment coils 10a and 10b. Accordingly, after the operation of axial alignment of the charged particle beam system, the axis of the beam B can be prevented from being more misaligned than prior to the operation of axial alignment. Consequently, the reliability of the system can be enhanced.

According to the present embodiment, in a case where the ratio R2 is not contained in the given range, at least one of the magnification and field of view can be varied, and the first through eighth image data can be again obtained. In consequence, the present embodiment yields the same advantageous effects as produced by the ninth embodiment.

12. Twelfth Embodiment

A charged particle beam system associated with a twelfth embodiment of the invention is next described. This system is similar in configuration to the charged particle beam system 200 already described in connection with FIG. 9.

The charged particle beam system, generally indicated by reference numeral 200, associated with the present embodiment is similar to the charged particle beam system 100 except that an image displacement vector length comparator 210 is added as shown in FIG. 9.

The image displacement vector length comparator 210 makes a decision as to whether the magnitude |W| of the sixth image displacement vector W indicating the amount of positional deviation between the ninth and tenth image data is greater than the magnitude |A| of the first image displacement vector A. For example, the ninth image data (frame 9) is obtained under conditions in which the accelerating voltage is HV+V1 (i.e., the focal position is the first position) and in which values of the excitation currents in the X alignment coil 10a and Y alignment coil 10b are optimum values calculated by the optimum value calculator 36. The tenth image data (frame 10) is obtained, for example, under conditions in which the accelerating voltage is HV+V2 (i.e., the focal position is the second position) and in which values of the excitation currents in the X alignment coil 10a and Y alignment coil 10b are optimum values calculated by the optimum value calculator 36.

Information about the sixth image displacement vector W is entered into the image displacement vector length comparator 210 from the image displacement vector calculator 34. If the components of the sixth image displacement vector |W| are represented by $(w_1, w_2)$, the magnitude |W| of this vector W can be calculated from the following equation.

$$W = \sqrt{w_1^2 + w_2^2}$$

Where the magnitude |W| of the sixth image displacement vector W is greater than the magnitude |A| of the first image displacement vector A, it is meant that the axis of the charged particle beam B taken after an axial alignment (i.e., when the ninth and tenth image data are obtained to calculate the sixth image displacement vector W) is more misaligned than prior to the start of the axial alignment (i.e., when the first and second image data for calculation of the first image displacement vector A are obtained). That is, the values of the excitation currents in the alignment coils 10a and 10b computed by the optimum value calculator 36 are made worse than prior to the start of the axial alignment.

If the image displacement vector length comparator 210 determines that the magnitude |W| of the sixth image displacement vector W is greater than the magnitude |A| of the first image displacement vector A, the comparator outputs decision information to the shooting condition setting device 30 for axial alignment. Based on the decision information, the setting device 30 varies at least one of the magnification and field of view and again obtains the first through eighth image data.

If the image displacement vector length comparator 210 determines that the magnitude |W| of the sixth image displacement vector W is less than the magnitude |A| of the first image displacement vector A, the comparator outputs decision information to the optimum value calculator 36. Based on the decision information, the optimum value calculator 36 outputs information about the calculated values of the excitation currents in the X alignment coil 10a and Y alignment coil 10b to the alignment coil driver amplifier 11, controlling the values of the excitation currents in the alignment coils 10a and 10b to the calculated current values.

The operation of the charged particle beam system 200 associated with the present embodiment is next described.

Figure 16:
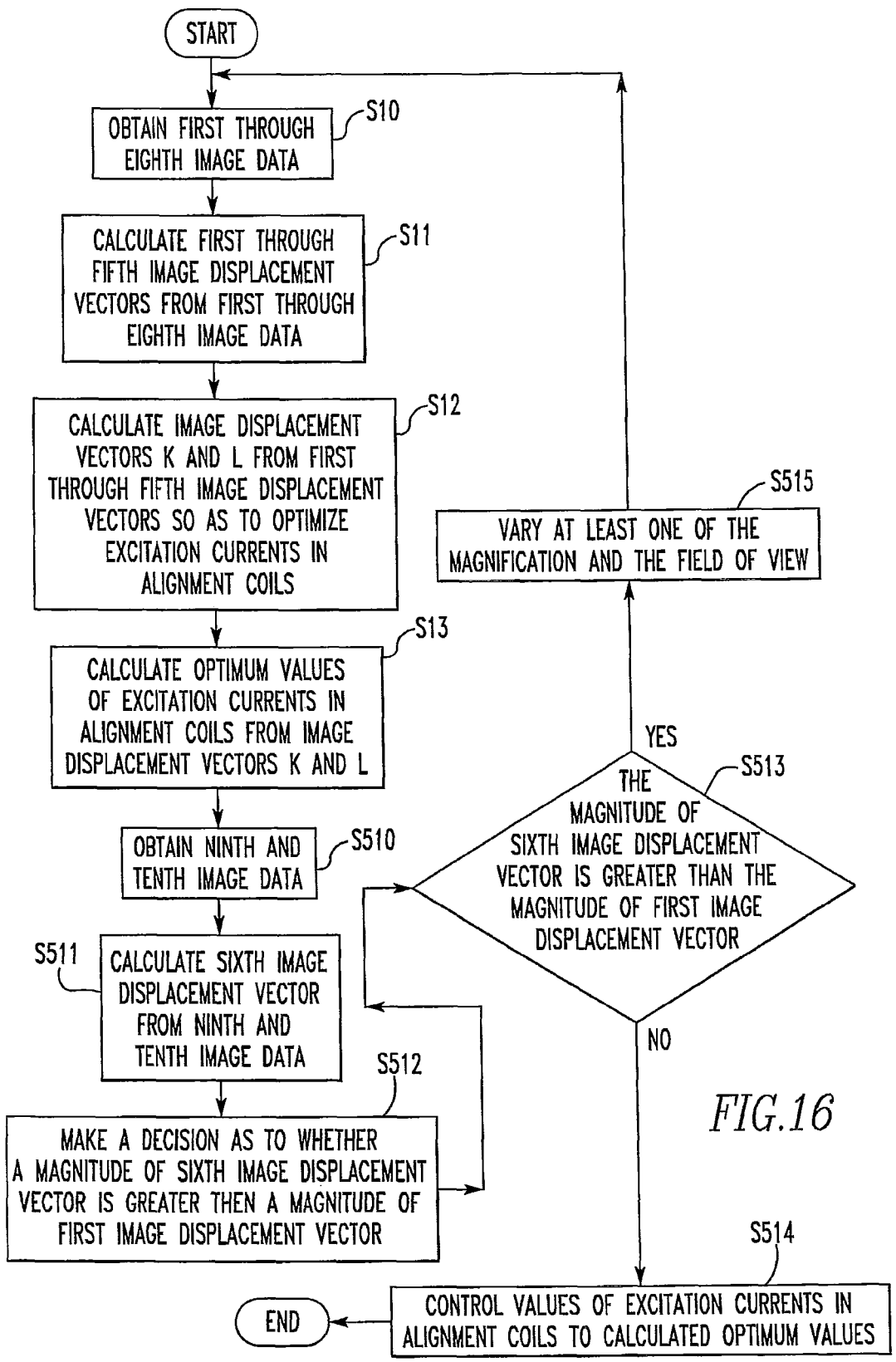
FIG. 16 is a flowchart illustrating a sequence of steps for making axial alignment of a charged particle beam, the steps being associated with a twelfth embodiment of the invention.

FIG. 16 is a flowchart illustrating one example of sequence of steps for axial alignment performed by the charged particle beam system 200 associated with the present embodiment.

This sequence of steps for axial alignment is similar to the sequence of steps for axial alignment performed by the charged particle beam system 100 except that steps S510, S511, S512, S513, and S515 are added. In step S510, the ninth and tenth image data are obtained. In step S511, the sixth image displacement vector is calculated from the ninth and tenth image data. In steps S512 and S513, a decision is made as to whether the magnitude of the sixth image displacement vector indicating the amount of positional deviation between the ninth and tenth image data is greater than the magnitude of the first image displacement vector. In step S515, at least one of the magnification of the obtained image and the field of view is varied.

In the present embodiment, the shooting condition setting device 30 for axial alignment performs the step (S510) for obtaining the ninth and tenth image data after the optimum value calculator 36 first controls the excitation currents in the alignment coils 10*a* and 10*b* to the calculated optimum values X3 and Y3 (S13).

Then, the image displacement vector calculator 34 calculates the sixth image displacement vector W from the ninth and tenth image data (S511).

The image displacement vector length comparator 210 then calculates the magnitude |W| of the image displacement vector W based on the information about the sixth image displacement vector W. Furthermore, the comparator 210 calculates the magnitude |A| of the first image displacement vector A.

The image displacement vector length comparator 210 then makes a decision as to whether the magnitude |W| of the sixth image displacement vector W is greater than the magnitude |A| of the first image displacement vector A (S512).

If the image displacement vector length comparator 210 determines that the magnitude |W| of the sixth image displacement vector W is greater than the magnitude |A| of the first image displacement vector A (YES at S513), then the values of the excitation currents calculated by the optimum value calculator 36 are regarded as inappropriate. Then, at least one of the magnification and field of view is varied, and the first through eighth image data are again acquired. The beam system 200 again finds the first through fifth image displacement vectors A, B, C, V, and U using the first through eighth image data obtained under the condition where at least one of the magnification and field of view was varied, and calculates optimum values of the excitation currents in the alignment coils 10*a* and 10*b* (S11, S12, S13, and S510-S515).

If the image displacement vector length comparator 210 determines that the magnitude |W| of the sixth image displacement vector W is less than the magnitude |A| of the first image displacement vector A (NO at S513), the optimum value calculator 36 controls the values of the excitation currents in the alignment coils 10*a* and 10*b* to the calculated current values. The beam system 200 terminates the processing routine.

In the present embodiment, the image displacement vector length comparator 210 makes a decision as to whether the magnitude NI of the sixth image displacement vector W is greater than the magnitude |A| of the first image displacement vector A. Therefore, after the operation of axial alignment of the charged particle beam system, the axis of the beam B can be prevented from being more misaligned than prior to the operation of axial alignment of the system. Hence, the reliability of the system can be enhanced.

13. Thirteenth Embodiment

Figure 17:
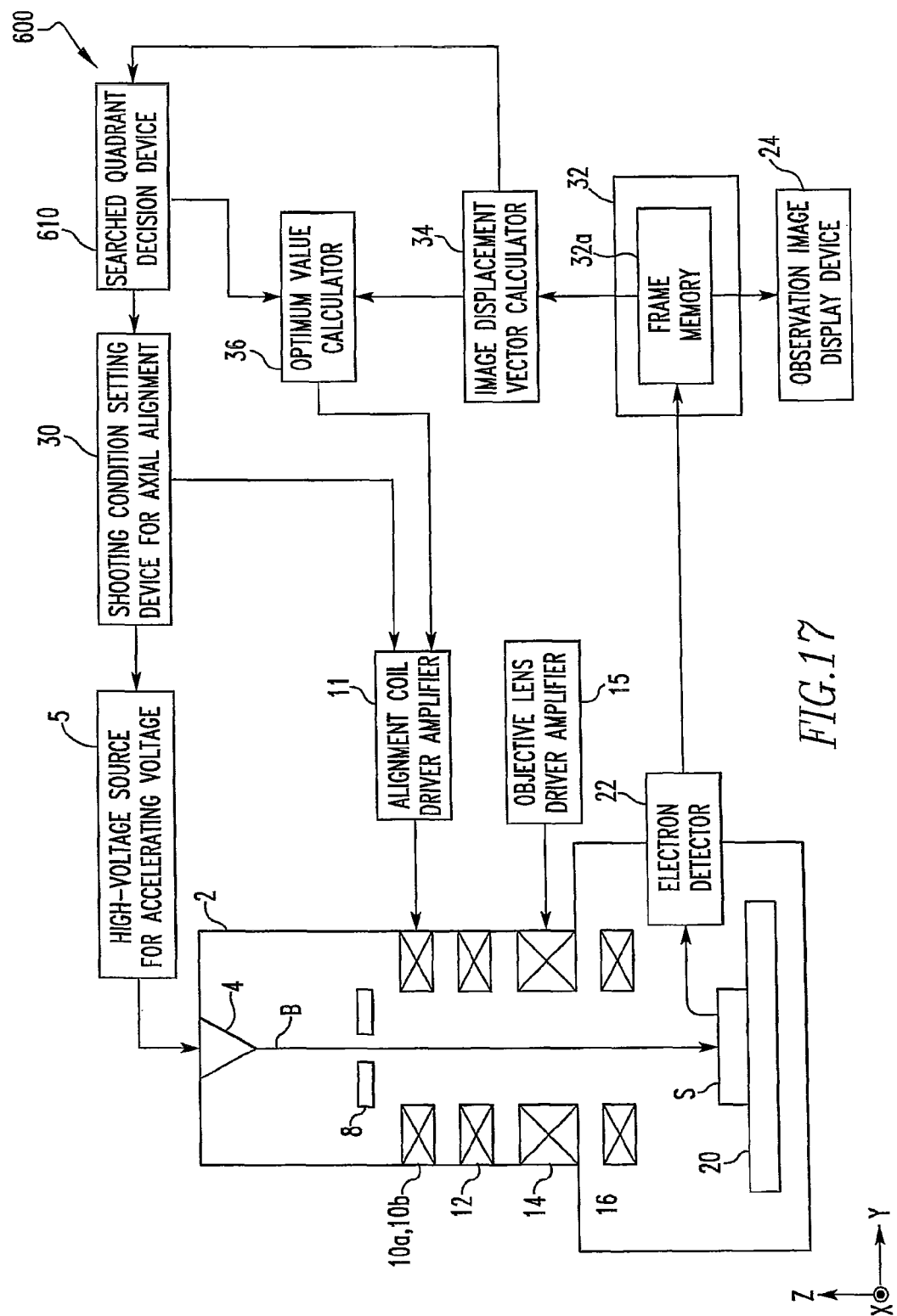
FIG. 17 is a block diagram illustrating the configuration of a charged particle beam system associated with a thirteenth embodiment of the invention.

A charged particle beam system associated with a thirteenth embodiment of the invention is next described. FIG. 17 is a diagram showing the configuration of this system, generally indicated by reference numeral 600. Those components of the charged particle beam system 600 associated with the thirteenth embodiment which are similar in function to their counterparts of the charged particle beam system 100 associated with the first embodiment are indicated by the same reference numerals as in the description of the first embodiment and their detailed description is omitted.

As shown in FIG. 17, the charged particle beam system 600 is similar to the charged particle beam system 100 except that a searched quadrant decision device 610 that is one example of image acquisition condition determining means is added.

The searched quadrant decision device 610 determines acquisition conditions under which the seventh and eighth image data are obtained, based on the first through fifth image data as described later.

Specifically, the searched quadrant decision device 610 selects two adjacent vectors of a set from the first through fourth image displacement vectors U1-U4 calculated by the image displacement vector calculator 34 from the first through fifth image data based on given conditions to thereby determine values of the excitation currents in the Y alignment coil 10*b* and X alignment coil 10*a* for the seventh and eighth image data, respectively. The searched quadrant decision device 610 selects the two adjacent vectors of the set from the sets of the first through fourth image displacement vectors U1-U4 in such a way that the angle made between these selected two angles is closest to the angle made between the direction in which the charged particle beam B is deflected by the X alignment coil 10*a* and the direction in which the beam B is deflected by the Y alignment coil 10*b* among the sets. As a consequence, in the image displacement vector coordinate system, the senses of the vectors AB and AC are towards the origin O at which the excitation currents in the alignment coils 10*a* and 10*b* are optimized. Hence, the optimum values of the excitation currents in the alignment coils 10*a* and 10*b* can be computed more accurately.

The searched quadrant decision device 610 outputs information about the determined excitation current values to the shooting condition setting device 30 for axial alignment. Furthermore, the decision device 610 outputs information about the selected set of vectors to the optimum value calculator 36.

The operation of the charged particle beam system 600 associated with the present embodiment is next described.

Figure 18:
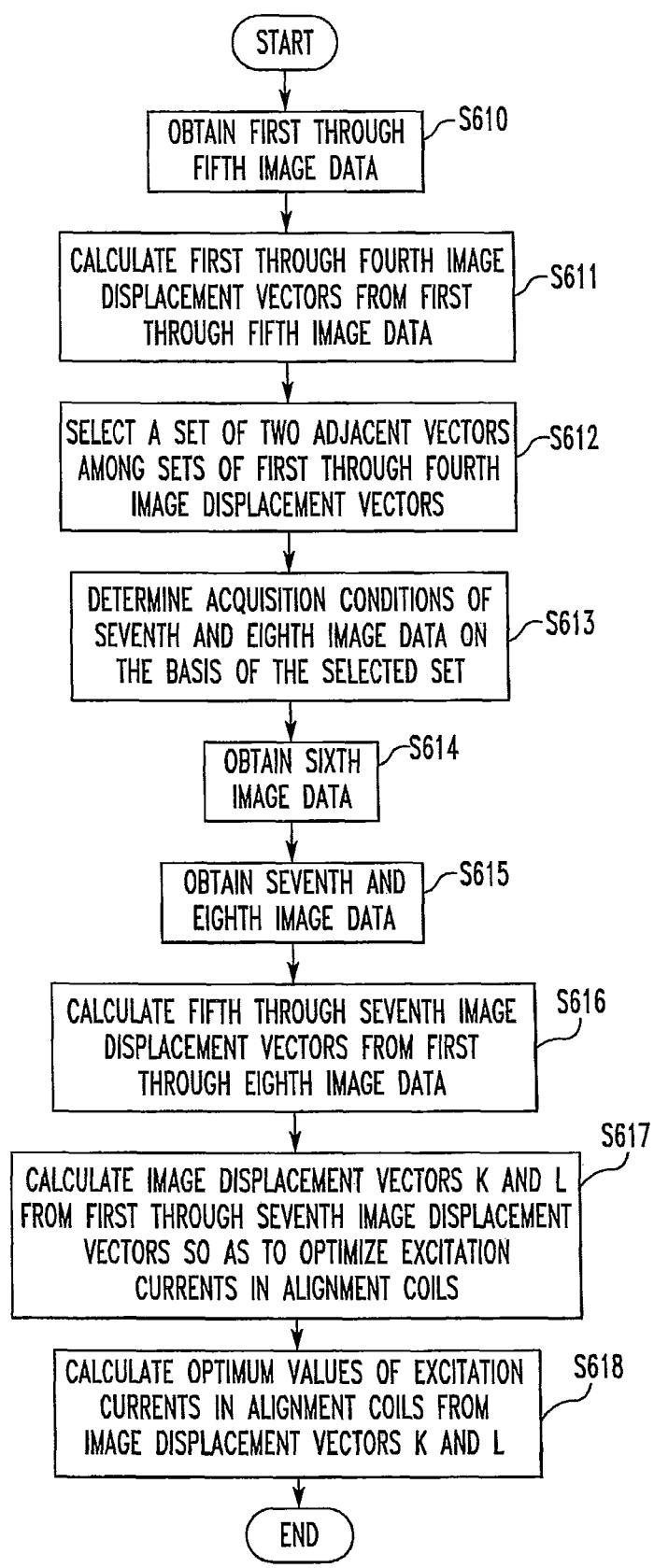
FIG. 18 is a flowchart illustrating a sequence of steps for making axial alignment of a charged particle beam, the steps being associated with the thirteenth embodiment.

FIG. 18 is a flowchart illustrating a sequence of steps for axial alignment performed by the charged particle beam system 600 associated with the present embodiment.

First, the shooting condition setting device 30 for axial alignment obtains the first through fifth image data (S610). The setting device 30 takes the frames 1-5 under conditions where the accelerating voltage, the excitation current in the X alignment coil 10*a*, and the excitation current in the Y alignment coil 10*b* are varied, thus obtaining the first through fifth image data. The frames 1-5 taken by the setting device 30 are stored as the first through fifth image data into the frame memory 32*a*. Furthermore, the shooting conditions under which the frames 1-5 (first through fifth image data) are taken are stored in the storage device 32.

FIG. 19 is a table showing the shooting conditions under which the frames 1-5 are taken. The shooting conditions include accelerating voltage, value of the excitation current in the X alignment coil, and value of the excitation current in the Y alignment coil. The frame 1 is taken under conditions HV+V1, X=ORG_X, and Y=ORG_Y. The frame 2 is taken under conditions HV+V1, X=ORG_X, and Y=ORG_Y+AL1. The frame 3 is taken under conditions HV+V1, X=ORG_X+AL1, and Y=ORG_Y. The frame 4 is taken under conditions HV+V1, X=ORG_X, and Y=ORG_Y−

AL1. The frame 5 is taken under conditions HV+V1, X=ORG_X−AL1, and Y=ORG_Y.

In the present embodiment, it is assumed, for example, that the incremental (decremental) amount V1=−50V at the accelerating voltage HV=10 kV and that AL1=+10 mA under the conditions that the excitation current values ORG_X=10 mA and ORG_Y=20 mA.

The image displacement vector calculator 34 calculates the first through fourth image displacement vectors from the first through fifth image data (S611).

The image displacement vector calculator 34 combines the five image data obtained by the shooting condition setting device 30 for axial alignment to calculate the first through fourth image displacement vectors U1, U2, U3, and U4.

In particular, the image displacement vector calculator 34 calculates the first image displacement vector U1 (hereinafter also referred to as the vector U1) from the amount of positional deviation between the first and third image data. The vector calculator 34 calculates the second image displacement vector U2 (hereinafter also referred to as the vector U2) from the amount of positional deviation between the first and second image data. The vector calculator 34 calculates the third image displacement vector U3 (hereinafter also referred to as the vector U3) from the amount of positional deviation between the first and fifth image data. The vector calculator 34 calculates the fourth image displacement vector U4 (hereinafter also referred to as the vector U4) from the amount of positional deviation between the first and fourth image data.

One example of the method of calculating the vectors U1-U4 is block matching relying on calculation of the cross-correlation between two images. The calculation of the cross-correlation is carried out by inverse Fourier transform of the product of the complex conjugates of two-dimensional Fourier transforms of two images. The coordinates of a maximum value of the results of the calculation of the two-dimensional cross-correlation give a displacement vector of an image.

FIG. 20 is a diagram illustrating the relationships among the first through fourth image displacement vectors U1-U4.

As shown in FIG. 20, the first quadrant is delimited by the vectors U1 and U2. The second quadrant is delimited by the vectors U2 and U3. The third quadrant is delimited by the vectors U3 and U4. The fourth quadrant is delimited by the vectors U4 and U1.

Referring still to FIG. 20, let θ1 be the angle made between the vectors U1 and U2. Let θ2 be the angle made between the vectors U2 and U3. Let θ3 be the angle made between the vectors U3 and U4. Let θ4 be the angle made between the vectors U4 and U1.

The searched quadrant decision device 610 then selects those two adjacent vectors of a set which form an angle closest to a given angle among the sets of the first through fourth image displacement vectors U1-U4 from these sets (S612).

The two adjacent vectors of a set delimit a quadrant as shown in FIG. 20. More specifically, one set of two adjacent vectors consists of the vectors U1 and U2. Another set consists of the vectors U2 and U3. A further set consists of the vectors U3 and U4. A still other set consists of the vectors U4 and U1.

The given angle is made between the direction in which the charged particle beam B is deflected by the X alignment coil 10a and the direction in which the beam B is deflected by the Y alignment coil 10b. In the present embodiment, the X alignment coil 10a deflects the beam B in the X direction (along the X-axis). The Y alignment coil 10b deflects the beam B in the Y direction (along the Y-axis). The X- and Y-axes are orthogonal to each other. Therefore, the angle made between the direction in which the beam B is deflected by the X alignment coil 10a and the direction in which the beam B is deflected by the Y alignment coil 10b is 90° in the present embodiment.

That is, in the present step S612, the searched quadrant decision device 610 selects a set of vectors forming an angle of any one of the angles θ1-θ4 from the set of vectors U1 and U2, the set of vectors U2 and U3, the set of vectors U3 and U4, and the set of vectors U4 and U1 such that the angle made between the selected vectors is closest to 90° among the sets.

Based on information about the selected set of vectors, the searched quadrant decision device 610 then determines acquisition conditions under which the seventh and eighth image data are obtained (S613).

FIG. 21 is a table showing shooting conditions under which the frames 6-8 are taken.

As shown in FIG. 21, the frame 6 for obtaining the sixth image data is taken under conditions HV+V2, X=ORG_X, and Y=ORG_Y. The frame 7 for obtaining the seventh image data is taken under conditions HV+V2, X=ORG_X, and Y=ORG_Y+ALY. The frame 8 for obtaining the eighth image data is taken under conditions HV+V2, X=ORG_X+ALX, and Y=ORG_Y.

The ALY is an amount of variation (incremental or decremental current value) of the current value in the Y alignment coil 10b. The ALX is an amount of variation (incremental or decremental current value) of the current value in the X alignment coil 10a. These incremental amounts ALY and ALX are determined based on the selected set of vectors.

Specifically, when the set of the vectors U1 and U2 (quadrant 1) is selected, the shooting conditions under which the frame 7 is taken are set to HV+V2, X=ORG_X, and Y=ORG_Y+AL1 by the searched quadrant decision device 610. The shooting conditions under which the frame 8 is taken are set to HV+V2, X=ORG_X+AL1, and Y=ORG_Y by the decision device.

When the set of the vectors U2 and U3 (quadrant 2) is selected, the shooting conditions under which the frame 7 is taken are set to HV+V2, X=ORG_X, and Y=ORG_Y+AL1 by the searched quadrant decision device 610. The shooting conditions under which the frame 8 is taken are set to HV+V2, X=ORG_X−AL1, and Y=ORG_Y by the decision device.

When the set of the vectors U3 and U4 (quadrant 3) is selected, the shooting conditions under which the frame 7 is taken are set to HV+V2, X=ORG_X, and Y=ORG_Y−AL1 by the searched quadrant decision device 610. The shooting conditions under which the frame 8 is taken are set to HV+V2, X=ORG_X−AL1, and Y=ORG_Y by the decision device.

When the set of the vectors U4 and U1 (quadrant 4) is selected, the shooting conditions under which the frame 7 is taken are set to HV+V2, X=ORG_X, and Y=ORG_Y−AL1 by the searched quadrant decision device 610. The shooting conditions under which the frame 8 is taken are set to HV+V2, X=ORG_X−AL1, and Y=ORG_Y by the decision device.

Because of the steps described so far, the acquisition conditions under which the seventh and eighth image data are obtained are determined.

The searched quadrant decision device 610 outputs information about the shooting conditions for the frames 7 and 8 to the shooting condition setting device 30 for axial alignment.

Then, the shooting condition setting device 30 for axial alignment obtains the sixth image data (S614).

The shooting condition setting device 30 for axial alignment takes the frame 6 under the shooting conditions of HV+V2, X=ORG_X, and Y=ORG_Y, and obtains the sixth image data. The sixth image data is stored in the frame memory 32a. No restrictions are imposed on the timing at which the sixth image data is obtained. The timing may be, for example, earlier than the acquisition of the seventh and eighth image data described later or earlier than acquisition of the first through fifth image data.

The shooting condition setting device 30 for axial alignment then obtains the seventh and eighth image data (S615).

Based on information about the shooting conditions for the frames 7 and 8 determined by the searched quadrant decision device 610, the shooting condition setting device 30 for axial alignment takes the frames 7 and 8 and obtains the seventh and eighth image data. The seventh and eighth image data are stored in the frame memory 32*a*.

The image displacement vector calculator 34 then calculates the fifth through seventh image displacement vectors A, B, and C from the first through eighth image data (S616).

The vector calculator 34 calculates the fifth image displacement vector A from the amount of positional deviation between the first and sixth image data.

The vector calculator 34 selects one of the second image data and fourth image data based on information about the set of vectors, and calculates the sixth image displacement vector B from the amount of positional deviation between the selected image data and the seventh image data. Information about the set of vectors is entered into the image displacement vector calculator 34 from the searched quadrant decision device 610.

Based on information about the set of vectors, the image displacement vector calculator 34 selects one of the third image data and the fifth image data and calculates the seventh image displacement vector C from the amount of positional deviation between the selected image data and the eighth image data.

Specifically, when the searched quadrant decision device 610 selects the set of the vectors U1 and U2 (quadrant 1), the image displacement vector calculator 34 selects the second image data and calculates the sixth image displacement vector B from the amount of positional deviation between the second image data and the seventh image data. Furthermore, the vector calculator 34 selects the third image data and calculates the seventh image displacement vector C from the amount of positional deviation between the third image data and the eighth image data.

When the searched quadrant decision device 610 selects the set of the vectors U2 and U3 (quadrant 2), the image displacement vector calculator 34 selects the second image data and calculates the sixth image displacement vector B from the amount of positional deviation between the second image data and the seventh image data. In addition, the vector calculator 34 selects the fifth image data and calculates the seventh image displacement vector C from the amount of positional deviation between the fifth image data and the eighth image data.

When the searched quadrant decision device 610 selects the set of the vectors U3 and U4 (quadrant 3), the image displacement vector calculator 34 selects the fourth image data and calculates the sixth image displacement vector B from the amount of positional deviation between the fourth image data and the seventh image data. In addition, the vector calculator 34 selects the fifth image data and calculates the seventh image displacement vector C from the amount of positional deviation between the fifth image data and the eighth image data.

When the searched quadrant decision device 610 selects the set of the vectors U4 and U1 (quadrant 4), the image displacement vector calculator 34 selects the fourth image data and calculates the sixth image displacement vector B from the amount of positional deviation between the fourth image data and the seventh image data. In addition, the vector calculator 34 selects the third image data and calculates the seventh image displacement vector C from the amount of positional deviation between the third image data and the eighth image data.

Furthermore, the image displacement vector calculator 34 receives the information about the set of vectors and selects the image displacement vectors V and U for calculation of optimum values of the excitation currents in the alignment coils 10*a* and 10*b* from among the first through fourth image displacement vectors U1-U4.

Specifically, when the searched quadrant decision device 610 selects the set of the vectors U1 and U2 (quadrant 1), the image displacement vector calculator 34 selects the first image displacement vector U1 and the second image displacement vector U2 as the image displacement vectors U and V, respectively.

When the searched quadrant decision device 610 selects the set of the vectors U2 and U3 (quadrant 2), the image displacement vector calculator 34 selects the third image displacement vector U3 and the second image displacement vector U2 as the image displacement vectors U and V, respectively.

When the searched quadrant decision device 610 selects the set of the vectors U3 and U4 (quadrant 3), the image displacement vector calculator 34 selects the third image displacement vector U3 and the fourth image displacement vector U4 as the image displacement vectors U and V, respectively.

When the searched quadrant decision device 610 selects the set of the vectors U4 and U1 (quadrant 4), the image displacement vector calculator 34 selects the first image displacement vector U1 and the fourth image displacement vector U4 as the image displacement vectors U and V, respectively.

In this way, the image displacement vector calculator 34 can obtain the image displacement vectors A, B, C, V, and U. The calculator 34 outputs the image displacement vectors A, B, C, V, and U to the optimum value calculator 36.

Figure 22:
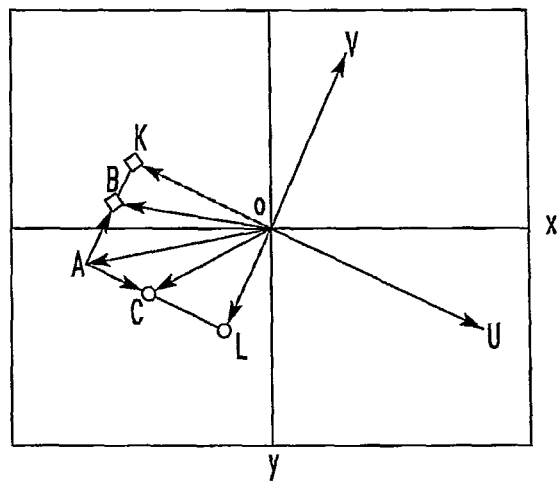
FIG. 22 is a diagram illustrating the relationships among image displacement vectors A, B, C, V, and U when a set of vectors U1 and U2 is selected.
Figure 23:
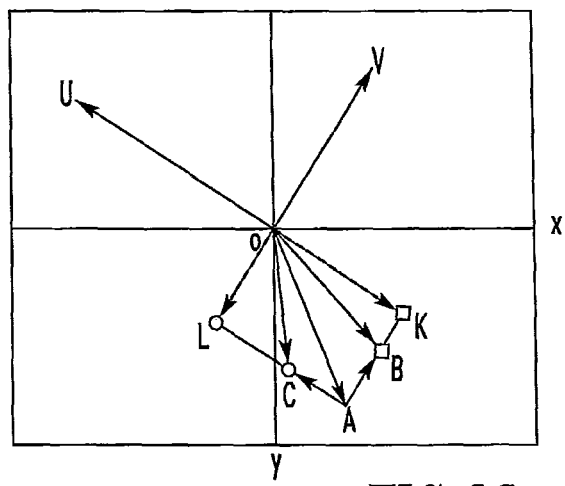
FIG. 23 is a diagram illustrating the relationships among image displacement vectors A, B, C, V, and U when a set of vectors U2 and U3 is selected.
Figure 24:
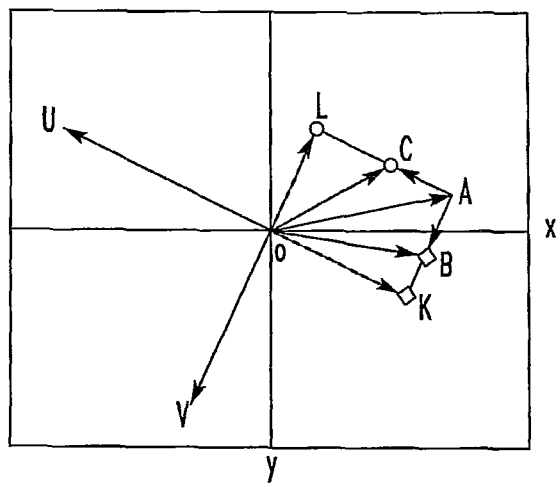
FIG. 24 is a diagram illustrating the relationships among image displacement vectors A, B, C, V, and U when a set of vectors U3 and U4 is selected.
Figure 25:
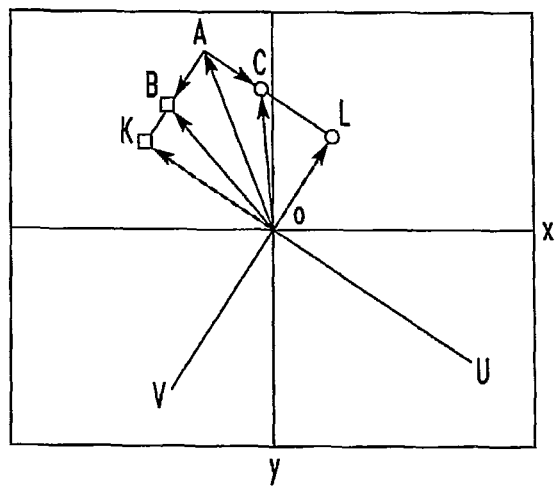
FIG. 25 is a diagram illustrating the relationships among image displacement vectors A, B, C, V, and U when a set of vectors U4 and U1 is selected.

FIG. 22 is a diagram illustrating the relationships among the image displacement vectors A, B, C, V, and U when the set of the vectors U1 and U2 (quadrant 1) is selected. FIG. 23 is a diagram illustrating the relationships among the image displacement vectors A, B, C, V, and U when the set of the vectors U2 and U3 (quadrant 2) is selected. FIG. 24 is a diagram illustrating the relationships among the image displacement vectors A, B, C, V, and U when the set of the vectors U3 and U4 (quadrant 3) is selected. FIG. 25 is a diagram illustrating the relationships among the image displacement vectors A, B, C, V, and U when the set of the vectors U4 and U1 (quadrant 4) is selected.

The image displacement vectors A, B, C, V, and U of the present embodiment shown in FIGS. 22-25 correspond to the image displacement vectors A, B, C, V, and U of the first embodiment. As shown in FIGS. 22-25, by finding the image displacement vectors A, B, C, V, and U by the above-described steps, the senses of the vectors AB and AC are toward the origin O at which the excitation currents in the alignment coils 10*a* and 10*b* are optimized in the image displacement vector coordinate system.

The image displacement vector A is different in direction among FIGS. 22-25, because the initial values of the excitation currents in the alignment coils 10*a* and 10*b* are different.

Then, the image displacement vectors K and L are calculated from the image displacement vectors A, B, C, V, and U in the same way as in the first embodiment and calculates optimum values of the excitation currents in the alignment coils 10a and 10b (S617 and S618).

The optimum value calculator 36 generates a control signal based on the calculated optimum values of the excitation currents in the alignment coils 10a and 10b. The calculator 36 outputs the control signal to the alignment coil driver amplifier 11 to control the excitation currents in the X and Y alignment coils 10a and 10b to the optimum values.

Because of the processing steps described so far, axial alignment of the charged particle beam B can be made.

According to the present embodiment, as described previously, optimum values of the excitation currents in the alignment coils 10a and 10b can be found from the 8 images (frames 1-8). Since the number of image data required to be obtained for axial alignment of the beam is small in this way, it is easy to make axial alignment of the beam. Accordingly, the burden on the operator of the system can be alleviated. The time taken to make axial alignment of the beam can be shortened.

In the present embodiment, the image displacement vectors A, B, C, V, and U are found by the above-described steps. Consequently, in the image displacement vector coordinate system, the senses of the vectors AB and AC are toward the origin O at which the excitation currents in the alignment coils 10a and 10b are optimized. Thus, the optimum values of the excitation currents in the alignment coils 10a and 10b can be computed more accurately, for the following reasons.

Figure 26:
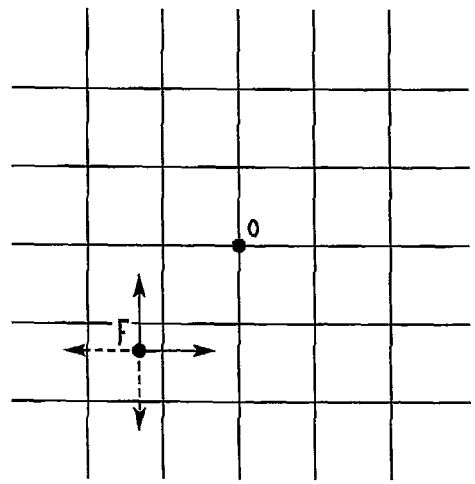
FIG. 26 is a diagram of an alignment coil current value coordinate system, and in which the value of the excitation current in an alignment coil is varied from its initial value by an incremental value.

FIG. 26 shows a coordinate system of alignment coil current values, and in which the values of the excitation currents in the alignment coils 10a and 10b have been varied from their initial values F by the incremental amount AL1. In FIG. 26, at the origin O, the excitation currents in the alignment coils 10a and 10b assume their optimum values. That is, the axis of the charged particle beam B is to be aligned at the origin O.

As shown in FIG. 26, when the values of the excitation currents in the alignment coils 10a and 10b are varied from the initial values F by the incremental amount AL1, vectors indicating the variations in the excitation currents in the alignment coils 10a and 10b may be directed away from the origin O as indicated by the broken lines. In such a case, the resolution of the image is severely deteriorated due to off-axis aberrations such as astigmatism and comatic aberration of the electron optical system. As a result, the image displacement vectors A, B, C, V, and U cannot be computed or errors in the image displacement vectors A, B, C, V, and U may be increased with undesirable results. Therefore, when the values of the excitation currents in the alignment coils 10a and 10b are varied from the initial values F by the incremental amount AL1, vectors indicating variations in the excitation currents in the alignment coils 10a and 10b are preferably directed toward the origin O indicated by the solid lines.

In the coordinate system of alignment coil current values shown in FIG. 26, if the vectors indicating variations in the excitation currents in the alignment coils 10a and 10b are directed away from the origin O, the vectors AB and AC are also directed away from the origin O in the coordinate system of image displacement vectors. In the coordinate system of alignment coil current values shown in FIG. 26, if the vectors indicating variations in the excitation currents in the alignment coils 10a and 10b are directed substantially toward the origin O, the vectors AB and AC are directed substantially toward the origin O in the coordinate system of image displacement vectors.

Figure 27:
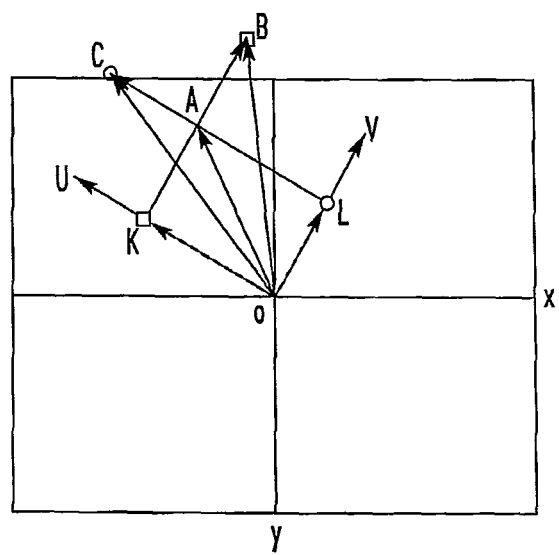
FIG. 27 is a diagram of an image displacement vector coordinate system, and in which vectors AB and AC are directed away from the origin O.

FIG. 27 is a diagram of a coordinate system of image displacement vectors, and in which the vectors AB and AC are directed away from the origin O. As shown in FIG. 27, the image displacement vectors B and C are greater than the image displacement vector A. The vectors AB and AC are directed away from the origin O. In this case, as described previously, the image displacement vectors B and C are calculated with increased error by the effects of aberrations. As a result, errors in the calculated optimum values of the excitation currents in the alignment coils 10a and 10b are also increased.

Figure 28:
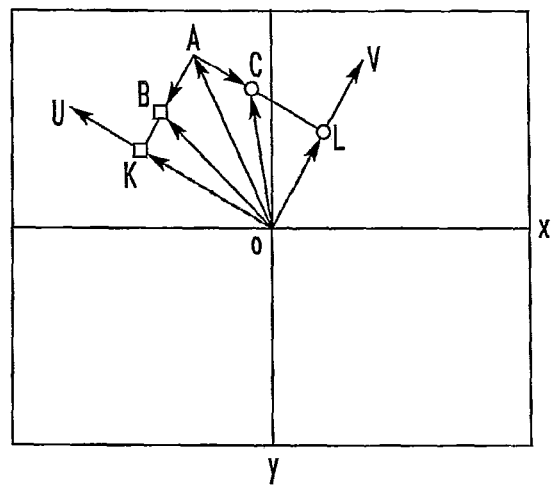
FIG. 28 is a diagram of an image displacement vector coordinate system, and in which the vectors AB and AC are directed substantially toward the origin O.

FIG. 28 is a diagram of a coordinate system of image displacement vectors, and in which the vectors AB and AC are directed substantially toward the origin O. In this case, the vectors are less affected by aberrations as described previously, and the image displacement vectors B and C can be calculated with reduced errors.

Therefore, according to the present embodiment, the image displacement vectors B and C can be found in such a way that the senses of the vectors AB and AC in the coordinate system of image displacement vectors as described previously are substantially toward the origin O at which the excitation currents in the alignment coils 10a and 10b are optimized. Therefore, the image displacement vectors B and C can be calculated with reduced errors. Optimum values of the excitation currents in the alignment coils 10a and 10b can be calculated more accurately.

In the present embodiment, two adjacent vectors of a set which make an angle (angle made between the direction in which the charged particle beam B is deflected by the X alignment coil 10a and the direction in which the beam B is deflected by the Y alignment coil 10b) closest to 90° among the sets of the first through fourth image displacement vectors U1-U4 are selected from these sets, for the following reason.

Figure 29:
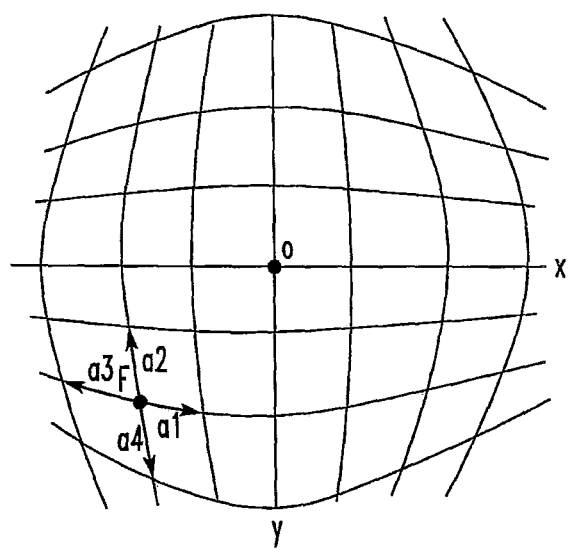
FIG. 29 is a diagram of an image displacement vector coordinate system, and in which an objective lens has barrel aberration.

FIG. 29 is a diagram showing a coordinate system of image displacement vectors, and in which an objective lens 14 has barrel aberration.

As shown in FIG. 29, the angle made between two image displacement vectors a1 and a2 directed substantially toward the origin O from the initial values F of the excitation currents in the alignment coils 10a and 10b is relatively close to 90°. In contrast, the angle made between two image displacement vectors a3 and a4 directed away from the center O from the initial values F deviates from 90° more greatly than the angle made between the vectors a1 and a2 by greater effects of aberrations.

Accordingly, in the present embodiment, by selecting two adjacent vectors of a set which make an angle closest to 90° among the sets of the first through fourth image displacement vectors U1-U4 are selected from these sets, the image displacement vectors B and C can be calculated such that the vectors AB and AC are directed substantially toward the origin O in the coordinate system of image displacement vectors. The technique of the present embodiment is especially effective where the initial values F of the excitation currents in the alignment coils 10a and 10b shown in FIG. 29 are remote from the origin O (i.e., the axis of the charged particle beam B deviates greatly).

In the example of FIG. 29, a case in which the objective lens 14 has barrel aberration has been described. If the objective lens 14 has other type of aberration such as pincushion aberration, the image displacement vectors B and C can be calculated such that the vectors AB and AC are directed substantially toward the origin O in a coordinate system of image displacement vectors by a similar technique 14. Modifications of Thirteenth Embodiment Modifications of the thirteenth embodiment of the invention are next described. Those components of charged particle beam systems associated with modifications of the thirteenth embodiment which are similar in function to their counterparts of the charged particle beam system 600 associated with the thirteenth embodiment are indicated by the same reference numerals as in the description of the thirteenth embodiment and their detailed description is omitted.

(1) First Modified Embodiment

Figure 30:
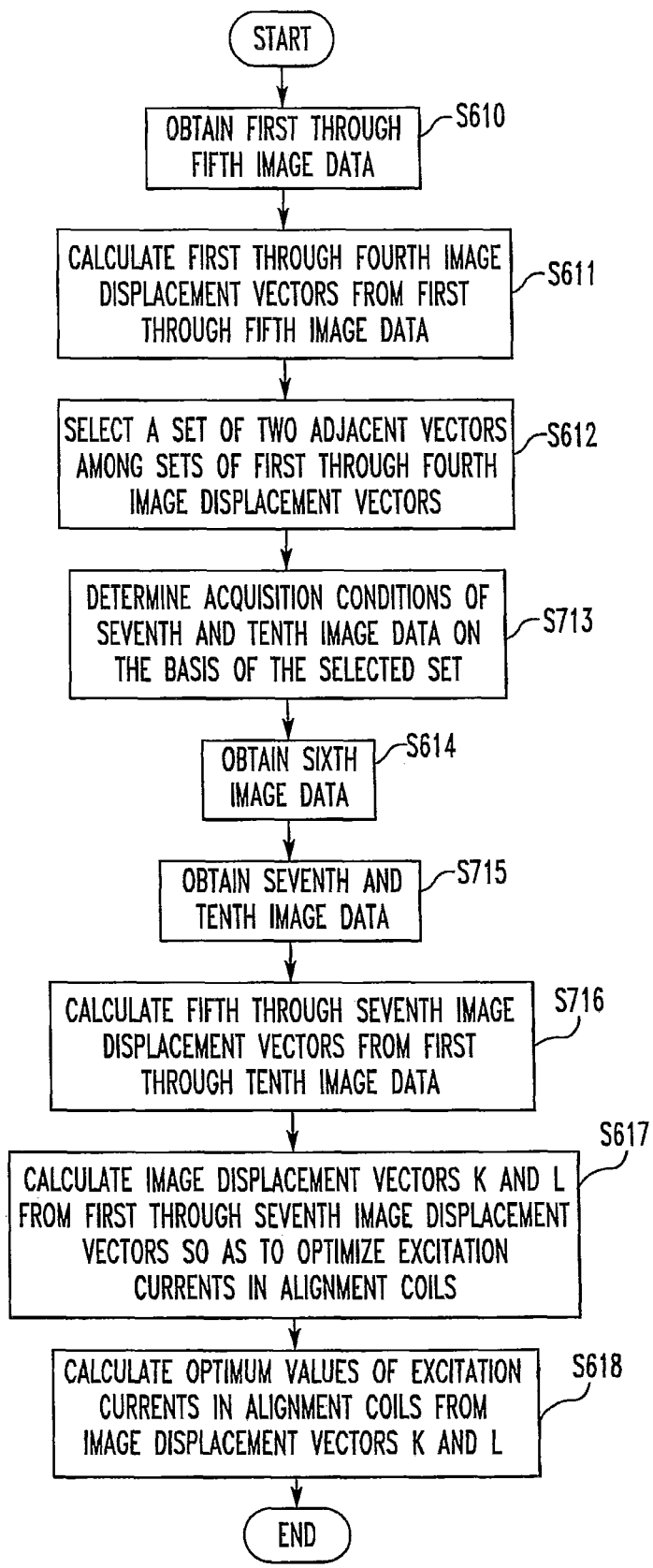
FIG. 30 is a flowchart illustrating a sequence of steps for making axial alignment of a charged particle beam, the steps being associated with a first modification of the thirteenth embodiment.
Figure 31:
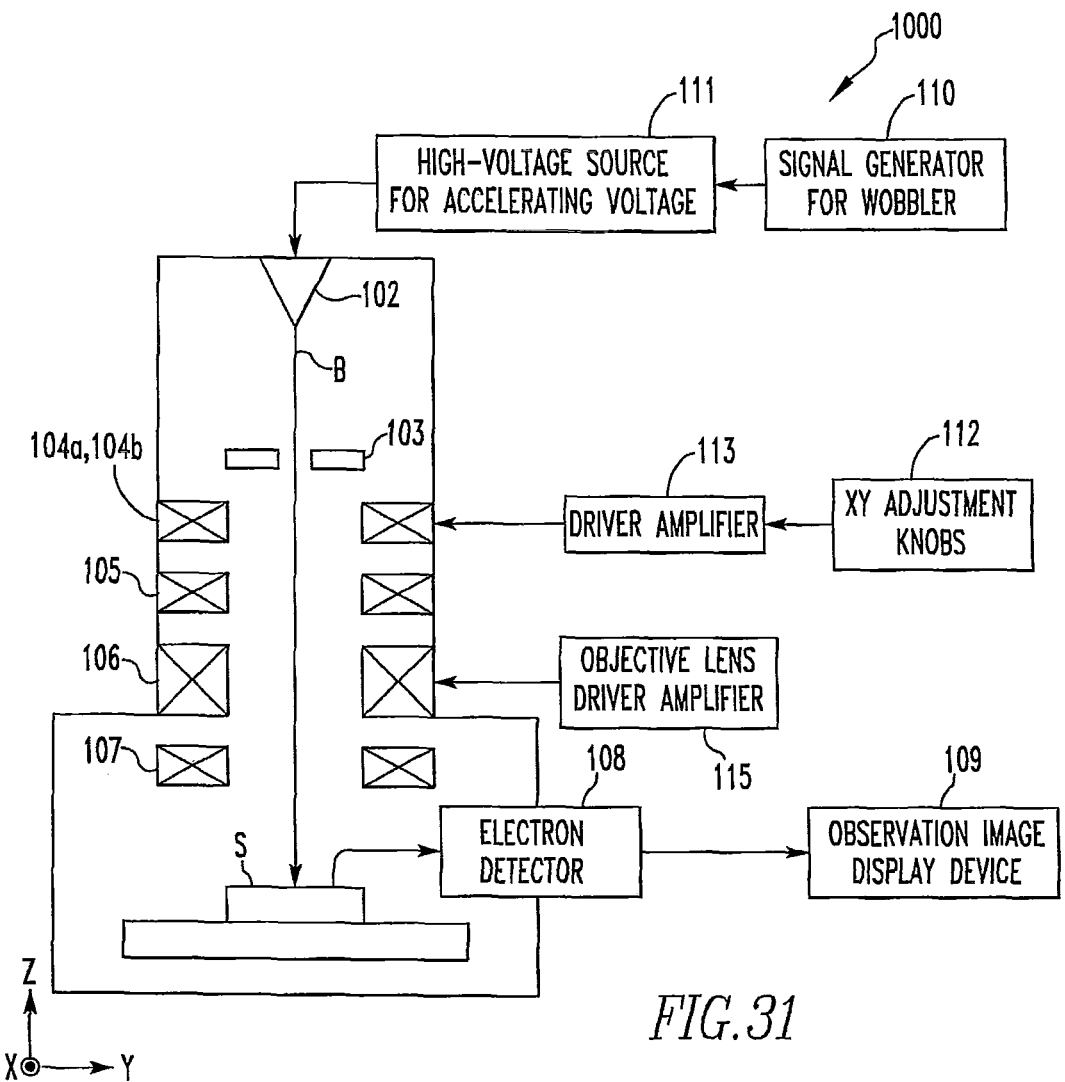
FIG. 31 is a block diagram of a related art scanning electron microscope.
Figure 32:
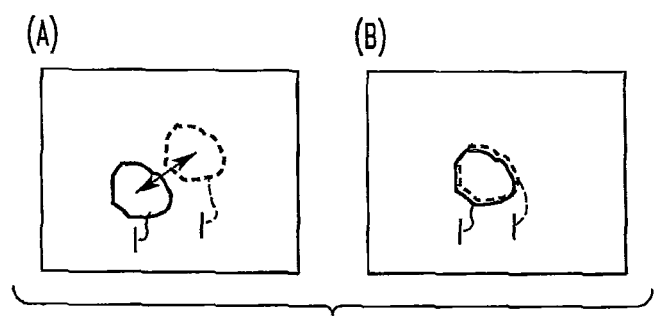
FIG. 32 illustrates the related art method of making axial alignment of a charged particle beam.

A first modified embodiment is first described. FIG. 30 is a flowchart of steps for making axial alignment of a charged particle beam associated with the first modified embodiment.

In the above-described thirteenth embodiment, the searched quadrant decision device 610 determines acquisition conditions under which the seventh and eighth image data are obtained (S613), and calculates the fifth through seventh image displacement vectors A, B, and C (S615 and S616). The present modified embodiment is similar to the thirteenth embodiment except that the searched quadrant decision device 610 determines acquisition conditions under which seventh through tenth image data are obtained (S713) and calculates the fifth through seventh image displacement vectors A, B, and C (S715 and S716). Therefore, these different steps S713, S715, and S716 are described below.

In the present modified embodiment, the searched quadrant decision device 610 determines acquisition conditions under which the seventh through tenth image data (frames 7-10) are obtained, based on the selected set of vectors (quadrant) (S713).

Specifically, when the searched quadrant decision device 610 selects the set of the vectors U1 and U2 (quadrant 1), the device sets the shooting conditions for the frame 7 to HV+V2, X=ORG_X, and Y=ORG_Y+AL2. The device sets the shooting conditions for the frame 8 to HV+2, X=ORG_X+AL2, and Y=ORG_Y. The device sets the shooting conditions for the frame 9 to HV+V1, X=ORG_X, and Y=ORG_Y+AL2. The device sets the shooting conditions for the frame 10 to HV+V1, X=ORG_X+AL2, and Y=ORG_Y.

When the searched quadrant decision device 610 selects the set of the vectors U2 and U3 (quadrant 2), the device sets the shooting conditions for the frame 7 to HV+V2, X=ORG_X, and Y=ORG_Y+AL2. The device sets the shooting conditions for the frame 8 to HV+V2, X=ORG_X−AL2, and Y=ORG_Y. The device sets the shooting conditions for the frame 9 to HV+V1, X=ORG_X, and Y=ORG_Y+AL2. The device sets the shooting conditions for the frame 10 to HV+V1, X=ORG_X−AL2, and Y=ORG_Y.

When the searched quadrant decision device 610 selects the set of the vectors U3 and U4 (quadrant 3), the device sets the shooting conditions for the frame 7 to HV+V2, X=ORG_X, and Y=ORG_Y−AL2. The device sets the shooting conditions for the frame 8 to HV+V2, X=ORG_X−AL2, and Y=ORG_Y. The device sets the shooting conditions for the frame 9 to HV+V1, X=ORG_X, and Y=ORG_Y−AL2. The device sets the shooting conditions for the frame 10 to HV+V1, X=ORG_X−AL2, and Y=ORG_Y.

When the searched quadrant decision device 610 selects the set of the vectors U4 and U1 (quadrant 4), the device sets the shooting conditions for the frame 7 to HV+V2, X=ORG_X, and Y=ORG_Y−AL2. The device sets the shooting conditions for the frame 8 to HV+V2, X=ORG_X+AL2, and Y=ORG_Y. The device sets the shooting conditions for the frame 9 to HV+V1, X=ORG_X, and Y=ORG_Y−AL2. The device sets the shooting conditions for the frame 10 to HV+V1, X=ORG_X+AL2, and Y=ORG_Y.

Because of the steps described so far, the acquisition conditions under which the seventh through tenth image data are obtained are determined.

The searched quadrant decision device 610 outputs information about the shooting conditions for the frames 7-10 to the shooting condition setting device 30 for axial alignment.

The setting device 30 takes the frames 7-10 based on the shooting conditions for the frames 7-10 and obtains the seventh through tenth image data (S715).

The image displacement vector calculator 34 calculates the fifth through seventh image displacement vectors A, B, and C from the first through tenth image data (S716).

Specifically, the image displacement vector calculator 34 calculates the fifth image displacement vector A from the amount of positional deviation between the first and sixth image data. Furthermore, the calculator 34 calculates the sixth image displacement vector B from the amount of positional deviation between the ninth and seventh image data. In addition, the calculator 34 computes the seventh image displacement vector C from the amount of positional deviation between the tenth and eighth image data.

In the present embodiment, the incremental amount AL1 by which the value of the excitation current in the alignment coil 10a is incremented or decremented can be made different from the incremental amount AL2 by which the value of the excitation current in the alignment coil 10b is incremented or decremented. In this case, the incremental amount AL1 can be made sufficiently large to obtain high computational accuracy and the incremental amount AL2 can be made sufficiently small to lie within the limit of block matching (e.g., smaller than the incremental amount AL1), as an example. Consequently, the shooting conditions can be alleviated while enhancing the computational accuracy.

(2) Second Modified Embodiment

A second modified embodiment is next described. In the above-described thirteenth embodiment, the searched quadrant decision device 610 selects two adjacent vectors of a set forming an angle closest to 90° among the sets of the first through fourth image displacement vectors U1-U4 from these sets. In contrast, in the present modified embodiment, the searched quadrant decision device 610 selects a set of image displacement vectors from the sets of the first through fourth image displacement vectors U1-U4, based on the sum of the magnitudes of two adjacent vectors forming the set.

This makes use of the phenomenon that the sum (|U1|+|U2|) of the magnitude |U1| of the vector U1 and the magnitude |U2| of the vector U2, the sum (|U2|+|U3|) of the magnitude |U2| of the vector U2 and the magnitude |U3| of the vector U3, the sum (|U3|+|U4|) of the magnitude |U3| of the vector U3 and the magnitude |U4| of the vector U4, and the sum (|U4|+|U1|) of the magnitude |U4| of the vector U4 and the magnitude |U1| of the vector U1 are not equal due to distortion caused by the deflection made by the alignment coils 10a and 10b. In the coordinate system of image displacement vectors, in a case where the magnitude of a vector decreases with going away from the origin O due to aberration, a set consisting of two adjacent vectors having magnitudes whose sum is greatest is selected. In a case where the magnitude of a vector increases with going away from the origin O due to aberration, a set consisting of two adjacent vectors having magnitudes whose sum is smallest is selected. The present modified embodiment can yield the same advantageous effects as the thirteenth embodiment.

It is to be noted that the above-described embodiments are exemplary embodiments and that the invention is not restricted thereto. For example, the embodiments and the modified embodiments can be combined appropriately.

For example, the functions of the shooting condition setting device 30 for axial alignment, image displacement vector calculator 34, optimum value calculator 36 shown in FIG. 1, the image displacement vector length comparator 210 shown in FIG. 9, the vector angle decision device 310 shown in FIG. 11, the vector ratio decision device 410 shown in FIG. 14, and the searched quadrant decision device 610 shown in FIG. 17 may be realized by hardware such as various processors (e.g., CPU and DSP), ASIC (e.g., gate array) or software.

The present invention embraces configurations substantially identical (e.g., in function, method, and results or in purpose and advantageous effects) with the configurations described in the preferred embodiments of the invention. Furthermore, the invention embraces the configurations described in the embodiments including portions which have replaced non-essential portions. In addition, the invention embraces configurations which produce the same advantageous effects as those produced by the configurations described in the preferred embodiments or which can achieve the same objects as the objects of the configurations described in the preferred embodiments. Further, the invention embraces configurations which are the same as the configurations described in the preferred embodiments and to which well-known techniques have been added.

Having thus described our invention with the detail and particularity required by the Patent Laws, what is desired protected by Letters Patent is set forth in the following claims.

The invention claimed is:

1. A method of making axial alignment of a charged particle beam in a charged particle beam system for adjusting the axis of the beam by a first alignment coil that deflects the beam in a first direction and a second alignment coil that deflects the beam in a second direction crossing the first direction, irradiating a sample with the beam, detecting a signal emanating from the sample, and obtaining image data, said method comprising the steps of:

obtaining at least first through sixth image data while varying acquisition conditions including a focal position of the beam on the sample in a direction of incidence, an excitation current in the first alignment coil, and an excitation current in the second alignment coil; and calculating a value of the excitation current in the first alignment coil and a value of the excitation current in the second alignment coil for the axial alignment of the beam from the at least first through sixth image data obtained by the step of obtaining the image data;

wherein during said step of obtaining the at least first through sixth image data, said first image data is obtained under conditions where said focal position is a first position, the value of the excitation current in said first alignment coil is a first electric current value, and the value of the excitation current in said second alignment coil is a second electric current value, said second image data is obtained under conditions where the focal position is a second position, the value of the excitation current in the first alignment coil is the first electric current value, and the value of the excitation current in the second alignment coil is the second electric current value, said third image data is obtained under conditions where the focal position is the first position, the value of the excitation current in the first alignment coil is the first electric current value, and the value of the excitation current in the second alignment coil is an electric current value obtained by varying the second electric current value by a first incremental current value, said fourth image data is obtained under conditions where the focal position is the second position, the value of the excitation current in the first alignment coil is the first electric current value, and the value of the excitation current in the second alignment coil is an electric current value obtained by varying the second electric current value by the first incremental current value, said fifth image data is obtained under conditions where the focal position is the first position, the value of the excitation current in the first alignment coil is an electric current value obtained by varying the first electric current value by the first incremental current value, and the value of the excitation current in the second alignment coil is the second electric current value, and said sixth image data is obtained under conditions where the focal position is the second position, the value of the excitation current in the first alignment coil is an electric current value obtained by varying the first electric current value by the first incremental current value, and the value of the excitation current in the second alignment coil is the second electric current value.

2. A method of making axial alignment of a charged particle beam as set forth in claim 1, wherein during said step of calculating the values, a first image displacement vector indicating an amount of positional deviation between the first image data and the second image data, a second image displacement vector indicating an amount of positional deviation between the third image data and the fourth image data, and a third image displacement vector indicating an amount of positional deviation between the fifth image data and the sixth image data are calculated, and wherein values of the excitation currents in the first and second alignment coils, respectively, for the axial alignment of the charged particle beam are calculated from the first through third image displacement vectors.

3. A method of making axial alignment of a charged particle beam as set forth in claim 2, wherein during said step of obtaining the at least first through sixth image data, seventh image data and eighth image data are also obtained, and wherein said seventh image data is obtained under conditions where the focal position is the first position, the value of the excitation current in the first alignment coil is the first electric current value, and the value of the excitation current in the second alignment coil is an electric current value obtained by varying the second electric current value by a second incremental current value, and said eighth image data is obtained under conditions where the focal position is the first position, the value of the excitation current in the first alignment coil is an electric current value obtained by varying the first electric current value by the second incremental current value, and the value of the excitation current in the second alignment coil is the second electric current value.

4. A method of making axial alignment of a charged particle beam as set forth in claim 3, wherein during said step of calculating the values, a fourth image displacement vector indicating an amount of positional deviation between the first image data and the seventh image data and a fifth image displacement vector indicating an amount of positional deviation between the first image data and the eighth image data are also calculated, and wherein values of the excitation currents in the first and second alignment coils, respectively, for the axial alignment of the charged particle beam are calculated from the first through fifth image displacement vectors.

5. A method of making axial alignment of a charged particle beam as set forth in claim 2, wherein during said step of calculating the values, a fourth image displacement vector indicating an amount of positional deviation between the first image data and the third image data and a fifth image displacement vector indicating an amount of positional deviation between the first image data and the fifth image data are also calculated, and wherein values of the excitation currents in the first and second alignment coils, respectively, for the axial alignment of the charged particle beam are calculated from the first through fifth image displacement vectors.

6. A charged particle beam system for adjusting the axis of a charged particle beam by a first alignment coil that deflects the beam in a first direction and a second alignment coil that deflects the beam in a second direction crossing the first direction, irradiating a sample with the beam, detecting a signal emanating from the sample, and obtaining image data, said charged particle beam system comprising:
   image data acquisition means for obtaining at least first through sixth image data while varying acquisition conditions including a focal position of the beam on the sample in the direction of incidence and excitation currents in the first and second alignment coils, respectively; and
   computing means for calculating values of the excitation currents in the first and second alignment coils, respectively, for the axial alignment of the beam from the at least first through sixth image data obtained by the image data acquisition means;
   wherein said first image data is obtained under conditions where the focal position is a first position, the value of the excitation current in the first alignment coil is a first electric current value, and the value of the excitation current in the second alignment coil is a second electric current value,
   said second image data is obtained under conditions where the focal position is a second position, the value of the excitation current in the first alignment coil is the first electric current value, and the value of the excitation current in the second alignment coil is the second electric current value,
   said third image data is obtained under conditions where the focal position is the first position, the value of the excitation current in the first alignment coil is the first electric current value, and the value of the excitation current in the second alignment coil is an electric current value obtained by varying the second electric current value by a first incremental current value,
   said fourth image data is obtained under conditions where the focal position is the second position, the value of the excitation current in the first alignment coil is the first electric current value, and the value of the excitation current in the second alignment coil is an electric current value obtained by varying the second electric current value by the first incremental current value,
   said fifth image data is obtained under conditions where the focal position is the first position, the value of the excitation current in the first alignment coil is a value obtained by varying the first electric current value by the first incremental current value, and the value of the excitation current in the second alignment coil is the second electric current value, and
   said sixth image data is obtained under conditions where the focal position is the second position, the value of the excitation current in the first alignment coil is an electric current value obtained by varying the first electric current value by the first incremental current value, and the value of the excitation current in the second alignment coil is the second electric current value.

7. A charged particle beam system as set forth in claim 6, wherein said computing means calculates a first image displacement vector indicating an amount of positional deviation between the first image data and the second image data, a second image displacement vector indicating an amount of positional deviation between the third image data and the fourth image data, and a third image displacement vector indicating an amount of positional deviation between the fifth image data and the sixth image data, and wherein values of the excitation currents in the first and second alignment coils, respectively, for the axial alignment of the charged particle beam are calculated from the first through third image displacement vectors.

8. A charged particle beam system as set forth in claim 7, wherein said image data acquisition means further obtains seventh and eighth image data, and
   wherein said seventh image data is obtained under conditions where the focal position is the first position, the value of the excitation current in the first alignment coil is the first electric current value, and the value of the excitation current in the second alignment coil is an electric current value obtained by varying the second electric current value by a second incremental current value, said eighth image data is obtained under conditions where the focal position is the first position, the value of the excitation current in the first alignment coil is an electric current value obtained by varying the first electric current value by the second incremental current value, and the value of the excitation current in the second alignment coil is the second electric current value.

9. A charged particle beam system as set forth in claim 8, wherein said computing means further calculates a fourth image displacement vector indicating an amount of positional deviation between the first image data and the seventh image data and a fifth image displacement vector indicating an amount of positional deviation between the first image data and the eighth image data, and wherein values of the excitation currents in the first and second alignment coils, respectively, for the axial alignment of the charged particle beam are calculated from the first through fifth image displacement vectors.

10. A charged particle beam system as set forth in claim 7, wherein said computing means further calculates a fourth image displacement vector indicating an amount of positional deviation between the first image data and the third image data and a fifth image displacement vector indicating an amount of positional deviation between the first image data and the fifth image data, and wherein values of the excitation currents in the first and second alignment coils, respectively, for the axial alignment of the charged particle beam are calculated from the first through fifth image displacement vectors.

11. A charged particle beam system as set forth in any one of claims 6 to 10, wherein said image data acquisition means controls said focal position by controlling at least one of an accelerating voltage of a beam source producing the charged particle beam and a value of an excitation current in an objective lens.

12. A method of making axial alignment of a charged particle beam as set forth in any one of claims 2 to 5, wherein during said step of calculating the values, a decision is made as to whether the calculated first through third image displacement vectors are used to calculate the values of the excitation currents in the first and second alignment coils, respectively, and wherein if the decision is that the first through third image displacement vectors are not used for the calculations, at least one of magnification and field of view is varied and the first through sixth image data are again obtained.

13. A method of making axial alignment of a charged particle beam as set forth in claim 4, wherein during said step of calculating the values, a decision is made as to whether the calculated fourth and fifth image displacement vectors are used to calculate the values of the excitation currents in the first and second alignment coils, respectively, and wherein if the decision is that the fourth and fifth image displacement vectors are not used for the calculations, at least one of magnification and field of view is varied and the first through sixth image data are again obtained.

14. A method of making axial alignment of a charged particle beam as set forth in any one of claims 2 to 5, further comprising the steps of:
obtaining two image data under conditions in which the values of the excitation currents in the first and second alignment coils, respectively, are calculated by said step of calculating the values and in which the two image data are obtained at different values of the focal position;
calculating a sixth image displacement vector from these two image data; and
making a second decision as to whether or not the sixth image displacement vector is greater in magnitude than the first image displacement vector;
wherein if the second decision is that the sixth image displacement vector is greater in magnitude than the first image displacement vector, at least one of magnification and field of view is varied and the first through sixth image data are again obtained.

15. A method of making axial alignment of a charged particle beam in a charged particle beam system for adjusting the axis of the beam by a first alignment coil that deflects the beam in a first direction and a second alignment coil that deflects the beam in a second direction crossing the first direction, irradiating a sample with the beam, detecting a signal emanating from the sample, and obtaining image data, said method comprising the steps of:
obtaining first through fifth image data under acquisition conditions where a focal position of the beam on the sample in the direction of incidence, an excitation current in the first alignment coil, and an excitation current in the second alignment coil are varied;
obtaining sixth image data;
calculating first through fourth image displacement vectors from the first through fifth image data;
determining acquisition conditions under which seventh and eighth image data are obtained, based on the first through fourth image displacement vectors;
obtaining the seventh and eighth image data based on the acquisition conditions determined by the determining step; and
calculating values of the excitation currents in the first and second alignment coils, respectively, for the axial alignment of the charged particle beam from the first through eighth image data obtained by the steps of obtaining the first through eighth image data;
wherein during said step of obtaining the first image data, said first image data is obtained under conditions where the focal position is a first position, the value of the excitation current in the first alignment coil is a first electric current value, and the value of the excitation current in the second alignment coil is a second electric current value,
said second image data is obtained under conditions where the focal position is the first position, the value of the excitation current in the first alignment coil is the first electric current value, and the value of the excitation current in the second alignment coil is an electric current value obtained by varying the second electric current value by a first incremental current value,
said third image data is obtained under conditions where the focal position is the first position, the value of the excitation current in the first alignment coil is an electric current value obtained by incrementing the first electric current value by the first incremental current value, and the value of the excitation current in the second alignment coil is the second electric current value,
said fourth image data is obtained under conditions where the focal position is the first position, the value of the excitation current in the first alignment coil is the first electric current value, and the value of the excitation current in the second alignment coil is an electric current value obtained by decrementing the second electric current value by the first incremental current value, and
said fifth image data is obtained under conditions where the focal position is the first position, the value of the excitation current in the first alignment coil is an electric current value obtained by decrementing the first electric current value by the first incremental current value, and the value of the excitation current in the second alignment coil is the second electric current value;
wherein during said step of obtaining the second image data, said sixth image data is obtained under conditions where the focal position is a second position, the value of the excitation current in the first alignment coil is the first electric current value, and the value in the excitation current in the second alignment coil is the second electric current value;
wherein during said step of calculating the first through fourth image displacement vectors, said first image displacement vector indicating an amount of positional deviation between the first image data and the third image data, said second image displacement vector indicating an amount of positional deviation between the first image data and the second image data, said third image displacement vector indicating an amount of positional deviation between the first image data and the fifth image data, and said fourth image data displacement vector indicating an amount of positional deviation between the first image data and the fourth image data are calculated;
wherein during said acquisition determining step, two adjacent vectors of a set are selected based on given conditions from the first through fourth image displacement vectors to thereby determine the values of the excitation currents in the second and first alignment coils, respectively, for the seventh and eighth image data, respectively; and
wherein during said step of obtaining the seventh and eighth image data, the seventh image data is obtained under conditions where the focal position is the second position, the value of the excitation current in the first alignment coil is the first electric current value, and the value of the excitation current in the second alignment coil is an electric current value determined by the acquisition condition determining step, and the eighth image data is obtained under conditions where the focal position is the second position, the value of the excitation current in the first alignment coil is an electric current value determined by the acquisition condition determining step, and the value of the excitation current in the second alignment coil is the second electric current value.

16. A method of making axial alignment of a charged particle beam as set forth in claim 15, wherein during said acquisition condition determining step, two adjacent angles of a set which make an angle closest to an angle made between said first direction and said second direction among sets of the first through fourth image displacement vectors are selected from these sets.

17. A method of making axial alignment of a charged particle beam as set forth in claim 15, wherein during said acquisition condition determining step, said set is selected from the sets of the first through fourth image displacement vectors based on a sum of magnitudes of two adjacent vectors of the set.

18. A method of making axial alignment of a charged particle beam as set forth in any one of claims 16 and 17, wherein during said step of calculating the values of the excitation currents in the first and second alignment coils,
   one of the second image data and the fourth image data is selected and one of the third image data and the fifth image data is selected based on the selected set,
   a fifth image displacement vector indicating an amount of positional deviation between the first image data and the sixth image data, a sixth image displacement vector indicating an amount of positional deviation between the selected one of the second and fourth image data and the seventh image data, and a seventh image displacement vector indicating an amount of positional deviation between the selected one of the third and fifth image data and the eighth image data are calculated, and
   the values of the excitation currents in the first and second alignment coils, respectively, for the axial alignment of the charged particle beam are calculated from the first through seventh image displacement vectors.

19. A charged particle beam system for adjusting the axis of a charged particle beam by a first alignment coil that deflects the beam in a first direction and a second alignment coil that deflects the beam in a second direction crossing the first direction, irradiating a sample with the beam, detecting a signal emanating from the sample, and obtaining image data, said charged particle beam system comprising:
   image data acquisition means for obtaining first through eighth image data while varying acquisition conditions including a focal position of the beam on the sample in the direction of incidence and excitation currents in the first and second alignment coils, respectively;
   image acquisition condition determining means for determining image acquisition conditions under which the seventh and eighth image data are obtained based on the first through fifth image data obtained by the image data acquisition means; and
   computing means for calculating values of the excitation currents in the first and second alignment coils, respectively, for the axial alignment of the charged particle beam from the first through eighth image data obtained by the image data acquisition means;
   wherein said first image data is obtained under conditions where the focal position is a first position, the value of the excitation current in the first alignment coil is a first electric current value, and the value of the excitation current in the second alignment coil is a second electric current value,
   said second image data is obtained under conditions where the focal position is the first position, the value of the excitation current in the first alignment coil is the first electric current value, and the value of the excitation current in the second alignment coil is an electric current value obtained by incrementing the second electric current value by a first incremental current value,
   said third image data is obtained under conditions where the focal position is the first position, the value of the excitation current in the first alignment coil is an electric current value obtained by incrementing the first electric current value by the first incremental current value, and the value of the excitation current in the second alignment coil is the second electric current value,
   said fourth image data is obtained under conditions where the focal position is the first position, the value of the excitation current in the first alignment coil is the first electric current value, and the value of the excitation current in the second alignment coil is an electric current value obtained by decrementing the second electric current value by the first incremental current value,
   said fifth image data is obtained under conditions where the focal position is the first position, the value of the excitation current in the first alignment coil is an electric current value obtained by decrementing the first electric current value by the first incremental current value, and the value of the excitation current in the second alignment coil is the second electric current value,
   said sixth image data is obtained under conditions where the focal position is a second position, the value of the excitation current in the first alignment coil is the first electric current value, and the value of the excitation current in the second alignment coil is the second electric current value,
   said seventh image data is obtained under conditions where the focal position is the second position, the value of the excitation current in the first alignment coil is the first electric current value, and the value of the excitation current in the second alignment coil is an electric current value determined by said image acquisition condition determining means, and
   said eighth image data is obtained under conditions where the focal position is the second position, the value of the excitation current in the first alignment coil is an electric current value determined by the image acquisition condition determining means, and the value of the excitation current in the second alignment coil is the second electric current value;
   wherein said computing means calculates a first image displacement vector indicating an amount of positional deviation between the first image data and the third image data, a second image displacement vector indicating an amount of positional deviation between the first image data and the second image data, a third image displacement vector indicating an amount of positional deviation between the first image data and the fifth image data, and a fourth image displacement vector indicating an amount of positional deviation between the first image data and the fourth image data; and
   wherein said image acquisition condition determining means selects two adjacent vectors of a set from the first through fourth image displacement vectors based on given conditions to thereby determine values of excitation currents in the second and first alignment coils, respectively, for the seventh and eighth image data, respectively.

20. A charged particle beam system as set forth in claim 19, wherein said image acquisition condition determining means selects two adjacent vectors of a set which make an angle closest to an angle made between the first direction and the second direction among the sets of the first through fourth image displacement vectors from these sets.

21. A charged particle beam system as set forth in claim 19, wherein said image acquisition condition determining means selects the set from the sets of the first through fourth image displacement vectors based on a sum of magnitudes of the two adjacent vectors of the set.

22. A charged particle beam system as set forth in one of claims 20 and 21, wherein said computing means
- selects one of the second image data and the fourth image data and selects one of the third image data and the fifth image data based on the selected set,
- calculates a fifth image displacement vector indicating an amount of positional deviation between the first image data and the sixth image data, a sixth image displacement vector indicating an amount of positional deviation between the selected one of the second image data and the fourth image data and the seventh image data, and a seventh image displacement vector indicating an amount of positional deviation between the selected one of the third image data and the fifth image data and the eighth image data, and
- calculates values of the excitation currents in the first and second alignment coils, respectively, for the axial alignment of the charged particle beam from the first through seventh image displacement vectors.

23. A method of making axial alignment of a charged particle beam as set forth in any one of claims 2 to 5, 13, and 15 to 17, further comprising the step of making a first decision as to whether or not an image displacement vector calculated from two image data which are different only in the focal position is greater than a given value, and wherein if the first decision is that the image displacement vector is greater than the given value, values of the excitation currents in the first and second alignment coils, respectively, for the axial alignment of the charged particle beam are calculated.

* * * * *

UNITED STATES PATENT AND TRADEMARK OFFICE
CERTIFICATE OF CORRECTION

PATENT NO. : 8,563,926 B2  
APPLICATION NO. : 13/313387  
DATED : October 22, 2013  
INVENTOR(S) : Mitsuru Yamada et al.

Page 1 of 1

It is certified that error appears in the above-identified patent and that said Letters Patent is hereby corrected as shown below:

In the Claims:

Column 51, Line 1, Claim 22, delete "in one of" and insert -- in any one of --

Signed and Sealed this
Twenty-fifth Day of February, 2014

Michelle K. Lee
*Deputy Director of the United States Patent and Trademark Office*